United States Patent
Jang et al.

(10) Patent No.: US 10,615,816 B2
(45) Date of Patent: Apr. 7, 2020

(54) METHOD FOR CANCELLING ECHO AND AN ELECTRONIC DEVICE THEREOF

(71) Applicant: Samsung Electronics Co., Ltd., Gyeonggi-do (KR)

(72) Inventors: Sung-Woon Jang, Gyeonggi-do (KR); Sang-Wook Shin, Seoul (KR)

(73) Assignee: Samsung Electronics Co., Ltd (KR)

( * ) Notice: Subject to any disclaimer, the term of this patent is extended or adjusted under 35 U.S.C. 154(b) by 43 days.

(21) Appl. No.: 15/160,629

(22) Filed: May 20, 2016

(65) Prior Publication Data

US 2017/0061980 A1    Mar. 2, 2017

(30) Foreign Application Priority Data

Aug. 25, 2015  (KR) .......... 10-2015-0119423

(51) Int. Cl.
| | | |
|---|---|---|
| G10K 11/178 | (2006.01) | |
| H04R 1/08 | (2006.01) | |
| H03M 1/66 | (2006.01) | |
| H04R 3/04 | (2006.01) | |
| H04R 3/12 | (2006.01) | |
| G10L 15/20 | (2006.01) | |

(52) U.S. Cl.
CPC ............. H03M 1/66 (2013.01); G10K 11/178 (2013.01); H04R 1/08 (2013.01); H04R 3/04 (2013.01); H04R 3/12 (2013.01); *G10K 2210/108* (2013.01); *G10L 15/20* (2013.01); *H04R 2499/11* (2013.01)

(58) Field of Classification Search
CPC . H03M 1/66; G10K 11/178; G10K 2210/108; H04R 1/08; H04R 3/04; H04R 3/12; H04R 2499/11; G10L 21/02; G10L 15/20; H04M 1/271
USPC ..... 381/66, 71.8, 71.13, 71.1, 122, 91, 94.7, 381/94.1; 700/94; 379/88.01
See application file for complete search history.

(56) References Cited

U.S. PATENT DOCUMENTS

| | | | |
|---|---|---|---|
| 2009/0017878 A1* | 1/2009 | Romesburg | H04M 1/03 455/570 |
| 2011/0007907 A1* | 1/2011 | Park | G10K 11/178 381/71.8 |

FOREIGN PATENT DOCUMENTS

| | | |
|---|---|---|
| KR | 10-0622252 | 9/2006 |
| KR | 10-2008-0015968 | 2/2008 |
| KR | 10-2010-0133723 | 12/2010 |

* cited by examiner

*Primary Examiner* — Vivian C Chin
*Assistant Examiner* — Con P Tran
(74) *Attorney, Agent, or Firm* — The Farrell Law Firm, P.C.

(57) ABSTRACT

The present disclosure relates to an apparatus and a method for cancelling echo by an electronic device. Here, a method of operating an electronic device includes converting a first digital signal related to a sound to be output through a plurality of speakers into a first analog signal; outputting the converted first analog signal as a sound using at least a part of the plurality of speakers; filtering at least a part of the converted first analog signal and/or the output sound and then generating a second analog signal; and outputting the second analog signal as another sound using at least another part of the plurality of speakers.

8 Claims, 20 Drawing Sheets

METHOD FOR CANCELLING ECHO AND AN ELECTRONIC DEVICE THEREOF

PRIORITY

This application claims priority under 35 U.S.C. § 119(a) to Korean Application Serial No. 10-2015-0119423, which was filed in the Korean Intellectual Property Office on Aug. 25, 2015, the entire content of which is incorporated herein by reference.

BACKGROUND

1. Field of the Disclosure

The present disclosure relates generally to an apparatus and method for cancelling an echo component by an electronic device.

2. Description of the Related Art

With the development of information, communication, and semiconductor technologies, various types of electronic devices have developed into multimedia devices that provide various multimedia services. For example, portable electronic devices may provide diverse multimedia services such as broadcast services, wireless Internet services, camera services, and music reproduction services.

The electronic device may provide various services to increase user convenience. For example, the electronic device may provide a recording service, a voice recording service during voice communication, a voice recognition service, and an audio service, such as a voice message, using an audio signal collected though a microphone.

A sound signal (audio signal or voice signal) output through a speaker by an electronic device may flow in as echo through a microphone of the electronic device. The electronic device may have a poor quality of audio service due to the echo flowing in through the microphone. For example, a voice recognition rate of the electronic device may deteriorate due to the echo flowing in through the microphone.

The electronic device may cancel an echo component in a signal flowing in through the microphone using an acoustic echo canceller (AEC) in order to prevent deterioration of performance due to the echo. For example, the electronic device may configure an audio signal or a voice signal output through a speaker as echo reference data. The electronic device may cancel or attenuate at least a part (e.g., an echo component) of a microphone input signal having a frequency characteristic similar to the echo reference data of the microphone input signal through a frequency analysis for the microphone input signal.

However, the electronic device may increase the amount of echo which flows in to a microphone due to an increase in the size of a signal output through a speaker and a structural change (e.g., slimness) of the electronic device, or distort the echo so that the electronic device cannot cancel the echo through the AEC. For example, when the echo component which flows in through the microphone is larger than the echo reference data, the electronic device may clip at least a part of the echo component which flows in through the microphone. The electronic device may not cancel the echo component due to a difference between the clipped echo component and the echo reference data. For example, when the echo component which flows in through the microphone is distorted by an external environmental element (e.g., a noise, and a delay), the electronic device may not cancel the echo component due to a difference between the distorted echo component and the echo reference data.

SUMMARY

The present disclosure has been made to address at least the problems and disadvantages described above, and to provide at least the advantages described below.

According to an aspect of the present disclosure, an apparatus and method for interrupting inflow of an echo component by an electronic device is provided.

According to another aspect of the present disclosure, an electronic device and an operation method thereof is provided to output, through an auxiliary output unit, an inverted phase signal corresponding to an audio signal output through a main output unit, thereby cancelling an echo component which flows in to an input unit (e.g., a microphone).

According to another aspect of the present invention, an electronic device and an operation method thereof is provided to filter the inverted phase signal corresponding to an audio signal output through a main output unit to correspond to an external environment parameter and then output the filtered inverted phase signal through an auxiliary output unit, thereby cancelling an echo component which flows in to an input unit (e.g., the microphone).

In accordance with an aspect of the present disclosure, an electronic device is provided. The electronic device may include: a housing; at least one microphone; a plurality of speakers; and a circuit included in the housing and electrically connected to the at least one microphone and the plurality of speakers, wherein the circuit is configured to receive a first digital signal related to a sound, convert the received first digital signal into a first analog signal, output the first analog signal as a first sound using at least a part of the plurality of speakers, filter at least one of at least a part of the first analog signal and at least a part of the output first sound to generate a second analog signal, obtain at least a part of the output first sound using the at least one microphone, convert the at least a part of the output first sound into a third analog signal, and cancel at least a first part of the third analog signal using the filtered second analog signal.

In accordance with another aspect of the present disclosure, a method of operating an electronic device is provided. The method may include: converting a first digital signal related to a sound into a first analog signal; outputting the first analog signal as a first sound using at least a part of the plurality of speakers; filtering at least one of at least a part of the first analog signal and/or at least a part of the output first sound to generate a second analog signal; and outputting the second analog signal as a second sound using at least another part of the plurality of speakers.

BRIEF DESCRIPTION OF THE DRAWINGS

The above and other aspects, features, and advantages of the present disclosure will be more apparent from the following detailed description taken in conjunction with the accompanying drawings, in which.

DETAILED DESCRIPTION

Figure 1:
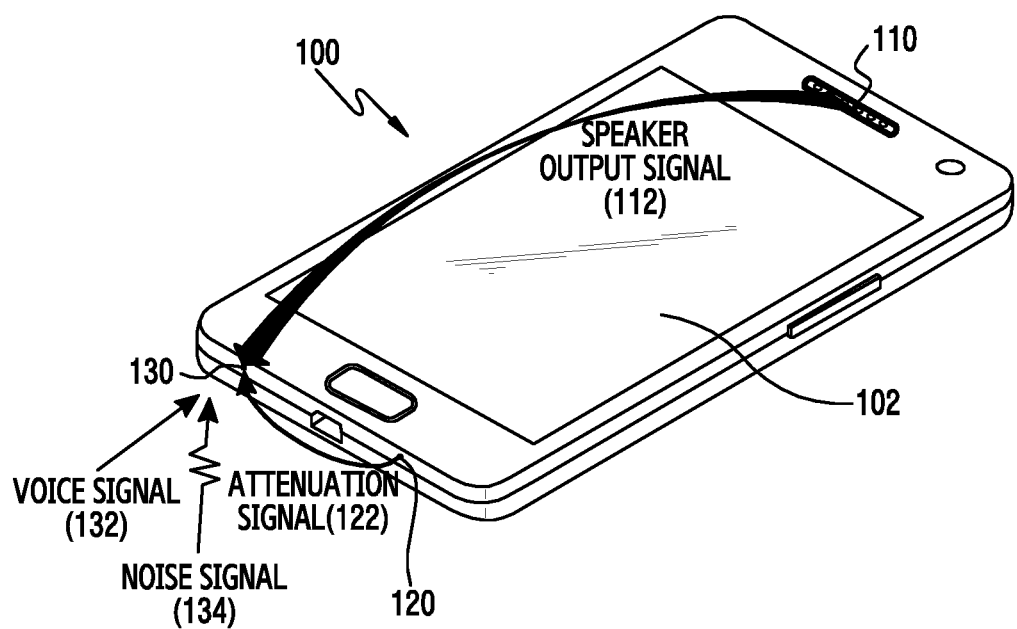
FIG. 1 illustrates an exterior configuration of an electronic device, according to an embodiment of the present disclosure.

Hereinafter, various embodiments of the present disclosure will be described with reference to the accompanying drawings, in which like reference numerals refer to similar elements. In the following description, specific details such as detailed configuration and components are merely provided to assist the overall understanding of these embodiments of the present disclosure. Therefore, it should be apparent to those skilled in the art that various changes and modifications of the embodiments described herein can be made without departing from the scope and spirit of the present disclosure. In addition, descriptions of well-known functions and constructions are omitted for clarity and conciseness.

The present disclosure may have various embodiments, and modifications and changes may be made therein. Therefore, the present disclosure will be described in detail with reference to particular embodiments shown in the accompanying drawings. However, it should be understood that the present disclosure is not limited to the particular embodiments, but includes all modifications, changes, equivalents, and/or alternatives falling within the spirit and the scope of the present disclosure. The terms "have", "may have", "include", and "may include" used herein indicate the presence of disclosed corresponding functions, operations, elements, and the like, and do not limit additional one or more functions, operations, elements, and the like. In addition, it should be understood that the terms "include" and "have" used in the various embodiments of the present disclosure are to indicate the presence of features, numbers, steps, operations, elements, parts, or a combination thereof described herein, and do not preclude the presence or addition of one or more other features, numbers, steps, operations, elements, parts, or a combination thereof.

The terms "A or B", "at least one of A or/and B" and "one or more of A or/and B" used herein include any and all combinations of words enumerated with it. For example, "A or B", "at least one of A and B" or "at least one of A or B" means (1) including A, (2) including B, or (3) including both A and B.

Although terms such as "first" and "second" used herein may modify various elements, these terms do not limit the corresponding elements. For example, these terms do not limit an order and/or importance of the corresponding elements. These terms may be used for the purpose of distinguishing one element from another element. For example, a first user device and a second user device both indicate user devices and may indicate different user devices. For example, a first element may be referred to as a second element without departing from the scope of right of various embodiments of the present disclosure, and similarly, a second element may be referred to as a first element.

It will be understood that when an element (e.g., first element) is (operatively or communicatively) "connected" or "coupled" with/to another element (e.g., second element), the first element may be directly connected or coupled to the second element, and there may be an intervening element (e.g., third element) between the first element and the second element. To the contrary, it will be understood that when an element (e.g., first element) is "directly connected" or "directly coupled" with/to another element (e.g., second element), there is no intervening element (e.g., third element) between the first element and the second element.

The expression "configured to (or set to)" used in various embodiments of the present disclosure may be replaced with "suitable for", "having the capacity to", "designed to", "adapted to", "made to", or "capable of" according to a situation. The term "configured to (set to)" does not necessarily mean "specifically designed to" in hardware. Instead, the expression "apparatus configured to . . . " may mean that the apparatus is "capable of . . . " along with other devices or parts in a certain situation. For example, "a processor configured to (set to) perform A, B, and C" may be a dedicated processor, e.g., an embedded processor, for performing a corresponding operation, or a generic-purpose processor, e.g., a central processing unit (CPU) or an application processor (AP), capable of performing a corresponding operation by executing one or more software programs stored in a memory device.

The terms as used herein are used merely to describe certain embodiments of the present disclosure and are not intended to limit the present disclosure. As used herein, singular forms may include plural forms as well unless the context explicitly indicates otherwise. Further, all the terms used herein, including technical and scientific terms, should be interpreted to have the same meanings as commonly understood by those skilled in the art to which the present disclosure pertains, and should not be interpreted to have ideal or excessively formal meanings unless explicitly so defined in various embodiments of the present disclosure.

An electronic device according to various embodiments of the present disclosure may include at least one of a smartphone, a tablet personal computer (PC), a mobile phone, a video phone, an electronic book (e-book) reader, a desktop PC, a laptop PC, a netbook computer, a workstation, a server, a personal digital assistant (PDA), a portable multimedia player (PMP), an MP3 player, a mobile medical appliance, a camera, and a wearable device (e.g., smart glasses, a head-mounted-device (HMD), electronic clothes, an electronic bracelet, an electronic necklace, an electronic appcessory, an electronic tattoo, a smart mirror, or a smart watch).

According to some embodiments, the electronic device may be a smart home appliance. The home appliance may include at least one of a television, a digital versatile disk (DVD) player, an audio, a refrigerator, an air conditioner, a vacuum cleaner, an oven, a microwave oven, a washing machine, an air cleaner, a set-top box, a home automation control panel, a security control panel, a TV box (e.g., Samsung HomeSync™, Apple TV™, or Google TV™), a game console (e.g., Xbox™ and PlayStation™), an electronic dictionary, an electronic key, a camcorder, and an electronic photo frame.

According to another embodiment, the electronic device may include at least one of various medical devices (e.g., various portable medical measuring devices (a blood glucose monitoring device, a heart rate monitoring device, a blood pressure measuring device, a body temperature measuring device, etc.), a magnetic resonance angiography (MRA), a magnetic resonance imaging (MRI), a computed tomography (CT) machine, and an ultrasonic machine), a navigation device, a global positioning system (GPS) receiver, an event data recorder (EDR), a flight data recorder (FDR), a vehicle infotainment devices, an electronic device for a ship (e.g., a navigation device, and a gyro-compass), an avionics device, a security device, an automotive head unit, a robot for home or industry, an automatic teller's machine (ATM), point of sales (POS) machine, or Internet of things (IoT) device (e.g., a light bulb, various sensors, electric or gas meter, a sprinkler device, a fire alarm, a thermostat, a streetlamp, a toaster, a sporting goods, a hot water tank, a heater, a boiler, etc.).

According to some embodiments, the electronic device may include at least one of a part of furniture or a building/ structure, an electronic board, an electronic signature receiving device, a projector, and various kinds of measuring instruments (e.g., a water meter, an electric meter, a gas meter, and a radio wave meter).

The electronic device according to various embodiments of the present disclosure may be a combination of one or more of the aforementioned various devices. The electronic device may be a flexible device.

Further, the electronic device according to an embodiment of the present disclosure is not limited to the aforementioned devices, and may include a new electronic device according to the development of new technologies Hereinafter, an electronic device according to various embodiments will be described with reference to the accompanying drawings. As used herein, the term "user" may indicate a person who uses an electronic device or a device (e.g., an artificial intelligence electronic device) that uses an electronic device.

FIG. 1 illustrates an exterior configuration of an electronic device, according to an embodiment of the present disclosure.

Referring to FIG. 1, an electronic device 100 includes a display 102 (e.g., including display circuitry) and a main output unit 110 (e.g., including main output circuitry) for outputting a sound may be included on an upper part of the electronic device 100. The electronic device 100 includes an auxiliary output unit 120 (e.g., including auxiliary output circuitry) outputting an attenuation signal 122 and an input unit 130 (e.g., including input circuitry) collecting a sound, on a lower part of the electronic device 100. The main output unit 110 and the auxiliary output unit 120 may be a speaker and the input unit 130 may be a microphone.

According to an embodiment, the electronic device 100 allows a sound signal 112 output through the main output unit 110 to flow into an echo component through the input unit 130. For example, the electronic device 100 may receive, through the input unit 130, a speaker output signal 112 of the main output unit 110, a voice signal 132 of a user, and an environment noise signal 134.

The electronic device 100 outputs the attenuation signal 122 through the auxiliary output unit 120, adjacent to a microphone 130, and then attenuates a sound signal output through the main output unit 110 before the sound signal flowing in to the microphone 130 together with the echo component. For example, the electronic device 100 configures an inverted phase signal of the sound signal output through the main output unit 110 as the attenuation signal to output the inverted phase signal through the auxiliary output unit 120. The electronic device 100 filters the inverted phase signal of the sound signal output through the main output unit 110 to corresponded to an external environment element, thereby outputting the inverted phase signal through the auxiliary output unit 120. Herein, the external environment element includes the environment noise signal 134, or signal distortion by a delay.

Figure 2:
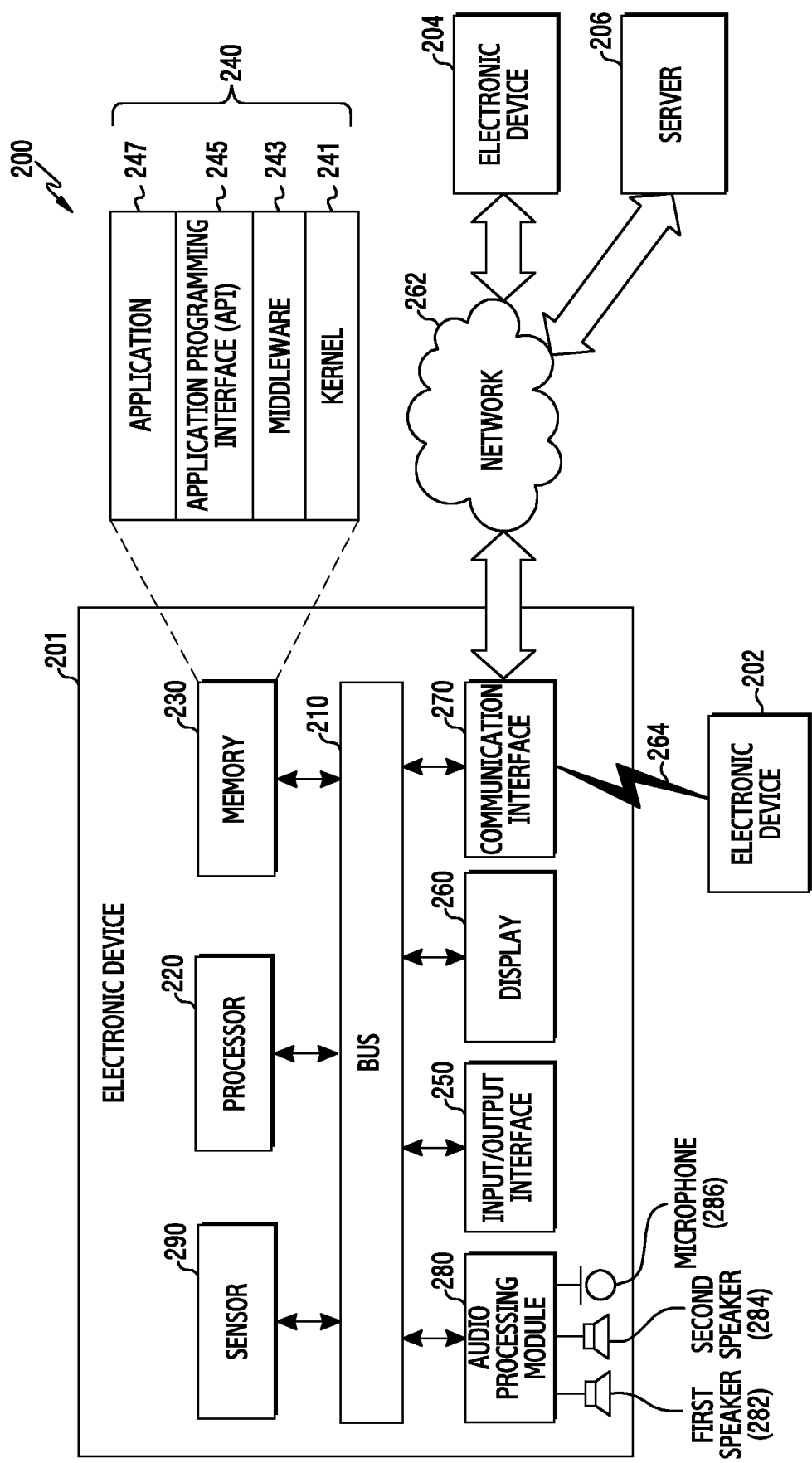
FIG. 2 illustrates an electronic device in a network environment, according to an embodiment of the present disclosure.

FIG. 2 illustrates an electronic device in a network environment, according to an embodiment of the present disclosure.

Referring to FIG. 2 an electronic device 201 in a network environment 200 is provided. The electronic device 201 includes a bus 210, a processor 220 (e.g., including processing circuitry), a memory 230, an input/output interface 250 (e.g., including input/output circuitry), a display 260 (e.g., including a display panel and display circuitry), a communication interface 270 (e.g., including communication circuitry), and an audio processing module 280 (e.g., including audio processing circuitry). In some embodiments, the electronic device 201 may omit at least one of the above elements or may further include other elements.

The bus 210 is a circuit which interconnects the components 220 to 270 of the electronic device 201 and delivers communication (for example, a control message and/or data) between the components.

The processor 220 includes one or more of a central processing unit (CPU), an application processor (AP), and a communication processor (CP). The processor 220 carries out operations or data processing relating to control and/or communication of one or more other elements of the electronic device 201.

According to an embodiment, the processor 220 controls the audio processing module 280 to output a sound signal through a first speaker 282. The processor 220 recognizes a voice based on an audio signal (e.g., a microphone input signal) provided from the audio processing module 280.

The memory 230 includes a volatile memory and/or a non-volatile memory. The memory 230 stores instructions or data relevant to at least one other element of the electronic device 201. The memory 230 stores software and/or a program 240. The program includes a kernel 241, a middleware 243, an application programming interface (API) 245, and an application (or application program) 247. At least some of the kernel 241, the middleware 243, and the API 245 may be referred to as an operating system (OS).

The input/output interface 250 functions as an interface that transfers instructions or data input from a user or another external device to the other elements of the electronic device 201. Also, the input/output interface 250 outputs instructions or data received from other elements of the electronic device 201 to the user or another external device.

The display 260 displays various types of contents (for example, text, images, videos, icons, or symbols) to the user. The display 260 includes a touch screen and receives a touch, gesture, proximity, or hovering input by using an electronic pen or the user's body part.

The communication interface 270 sets communication between the electronic device 201 and a first external electronic device 202, a second external electronic device 204, or a server 206. The communication interface 270 is connected to a network 262 through wireless or wired communication to communicate with the second external electronic device 204 or the server 206. For example, the communication interface 270 communicates with the first external electronic device 202 through short-range communication 264.

The network 262 includes at least one of a communication network such as a computer network (e.g., a LAN or a WAN), the Internet, and a telephone network.

Each of the first and second external electronic devices 202 and 204 may be of a type identical to or different from that of the electronic device 201. According to an embodiment, the server 206 may include a group of one or more servers.

According to various embodiments, all or some of the operations performed in the electronic device 201 may be performed in another electronic device or a plurality of electronic devices (e.g., the electronic devices 202 and 204 or the server 206). When the electronic device 201 has to perform some functions or services automatically or in response to a request, the electronic device 201 may make a request for performing at least some functions relating thereto to the electronic device 202 or 204 or the server 206 instead of performing the functions or services by itself or in addition. The electronic devices 202 and 204 or the server 206 may execute the requested functions or the additional functions, and deliver a result of the execution to the electronic device 201. The electronic device 201 provides the received result as it is or additionally process the result and provide the requested functions or services. To achieve this cloud computing, distributed computing, or client-server computing technology may be used.

The audio processing module 280 provides an audio interface between a user and the electronic device 200 through a plurality of speakers 282 and 284 and a microphone 286. The second speaker 284 may be located in an area adjacent to the microphone 286, and may output an attenuation signal at a volume smaller than a reference volume. The reference volume refers to a volume the size of a preconfigured sound signal to allow a sound signal (attenuation signal) output through the second speaker 284 not to be affected by a sound signal output through the first speaker 282.

According to an embodiment, the audio processing module 280 converts a sound signal (e.g., a voice signal) provided from the processor 220 into an analog signal and then outputs the analog signal through the first speaker 282 (e.g., the main output unit). The audio processing module 280 generates an attenuation signal corresponding to the sound signal through the first speaker 282 and then outputs the attenuation signal through the second speaker 284 (e.g., an auxiliary output unit). For example, the audio processing module 280 outputs, through the second speaker 284, the attenuation signal obtained by inverting a phase of the sound signal through the first speaker 282. The audio processing module 280 detects an external environment parameter (e.g., a noise, and delay distortion) from a microphone input signal collected through the microphone 286. The audio processing module 280 filters an inverted phase of the sound signal to correspond to an external environment element through the first speaker 282, thereby outputting the filtered phase signal through the second speaker 284.

According to an embodiment, the audio processing module 280 cancels at least a part of an echo component included in the microphone input signal collected through the microphone 286 based on an echo reference data corresponding to the sound signal through the first speaker 282.

Figure 3:
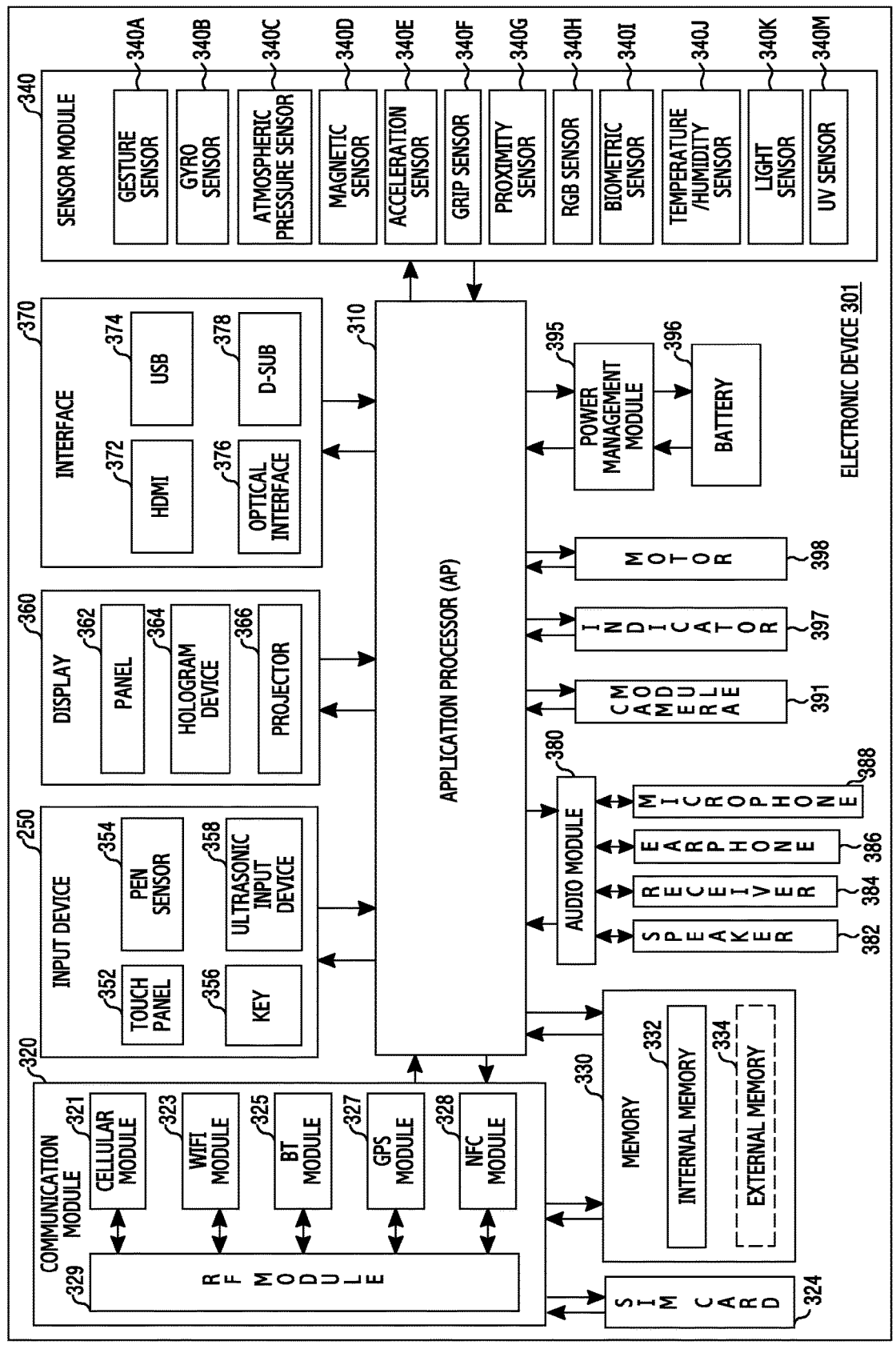
FIG. 3 is a block diagram of an electronic device, according to an embodiment of the present disclosure.

FIG. 3 is a block diagram illustrating an electronic device, according to an embodiment of the present disclosure.

Referring to FIG. 3, an electronic device 300 is provided. The electronic device 301 may constitute all or a part of the electronic device 201 illustrated in FIG. 2. The electronic device 301 includes at least one AP 310, a communication module 320, a subscriber identification module (SIM) card 324, a memory 330, a sensor module 340, an input device 350, a display 360, an interface 370, an audio module 380, a camera module 391, a power management module 395, a battery 396, an indicator 397, and a motor 398.

The processor 310 controls a plurality of hardware or software components connected to the processor 310 by driving an operating system or an application program and perform processing of various pieces of data and calculations. The processor 310 may be implemented by a system on chip (SoC).

According to an embodiment, the processor 310 may further include a graphic processing unit (GPU) and/or an image signal processor. The processor 310 includes at least some (for example, a cellular module 321) of the elements illustrated in FIG. 3. The processor 310 loads, into a volatile memory, instructions or data received from at least one (for example, a non-volatile memory) of the other elements of the electronic device 300 and processes the loaded instructions or data, and stores various data in a non-volatile memory.

The communication module 320 may have a configuration equal or similar to that of the communication interface 270 of FIG. 2. The communication module 320 includes a cellular module 321, a Wi-Fi module 323, a Bluetooth module 325, a GNSS module 327 (e.g., a GPS module, a Glonass module, a Beidou module, or a Galileo module), a near field communication (NFC) module 328, and a radio frequency (RF) module 329.

The cellular module 321 provides a voice call, an image call, a text message service, or an Internet service through a communication network. The cellular module 321 may identify and authenticate the electronic device 301 within a communication network using the SIM card 324.

According to an embodiment, the cellular module 321 may perform at least some of the functions that the processor 310 may provide. The cellular module 321 may include a CP.

The Wi-Fi module 323, the Bluetooth module 325, the GNSS module 327, or the NFC module 328 may include a processor that processes data transmitted and received through the corresponding module. According to some embodiments, at least some of the cellular module 321, the Wi-Fi module 323, the Bluetooth module 325, the GNSS module 327, and the NFC module 328 may be included in one integrated chip (IC) or IC package.

The RF module 329 may transmit and receive a communication signal (for example, an RF signal).

According to an embodiment of the present disclosure, at least one of the cellular module 321, the Wi-Fi module 323, the Bluetooth module 325, the GNSS module 327, and the NFC module 328 may transmit and receive RF signals through a separate RF module.

The SIM card 324 is a card including a subscriber identity module and/or an embedded SIM, and contains unique identification information (for example, an Integrated Circuit Card Identifier (ICCID)) or subscriber information (for example, an International Mobile Subscriber Identity (IMSI)).

The memory 330 includes an embedded memory 332 or an external memory 334. The external memory 334 may be functionally and/or physically connected to the electronic device 301 through various interfaces.

The sensor module 340 measures a physical quantity or detects an operation state of the electronic device 301, and may convert the measured or detected information into an electrical signal. The sensor module 340 may include at least one of a gesture sensor 340A, a gyro sensor 340B, an atmospheric pressure sensor 340C, a magnetic sensor 340D, an acceleration sensor 340E, a grip sensor 340F, a proximity sensor 340G, a red, green, blue (RGB) sensor 340H, a biometric sensor 340I, a temperature/humidity sensor 340J, a light sensor 340K, and a ultraviolet (UV) sensor 340M. Additionally or alternatively, the sensor module 340 may include an E-nose sensor, an electromyography (EMG) sensor, an electroencephalogram (EEG) sensor, an electrocardiogram (ECG) sensor, an Infrared (IR) sensor, an iris sensor, and/or a fingerprint sensor. The sensor module 340 may further include a control circuit for controlling one or more sensors included therein. In some embodiments, the electronic device 301 may further include a processor configured to control the sensor module 340 as a part of or separately from the processor 310, and may control the sensor module 340 while the processor 310 is in a sleep state.

The input device 350 may include a touch panel 352, a (digital) pen sensor 354, a key 356, and an ultrasonic input unit 358.

The touch panel 352 may use at least one of a capacitive type, a resistive type, an infrared type, and an ultrasonic type. Also, the touch panel 352 may further include a control circuit. The touch panel 352 may further include a tactile layer and provide a tactile reaction to the user.

The (digital) pen sensor 354 may include a recognition sheet which is a part of the touch panel or is separated from the touch panel.

The key 356 may include a physical button, an optical key or a keypad.

The ultrasonic input device 358 detects ultrasonic waves generated by an input tool through a microphone 388 and identifies data corresponding to the detected ultrasonic waves.

The display 360 (e.g., display 260) may include a panel 362, a hologram device 364 or a projector 366.

The panel 362 may include a configuration identical or similar to that of the display 260 illustrated in FIG. 2. The panel 362 may be implemented to be flexible, transparent, or wearable. The panel 362 and the touch panel 352 may be implemented as one module.

The hologram device 364 displays a three dimensional image in the air by using an interference of light.

The projector 366 displays an image by projecting light onto a screen. The screen may be located inside or outside the electronic device 301.

According to an exemplary embodiment, the display 360 may further include a control circuit for controlling the panel 362, the hologram device 364, or the projector 366.

The interface 370 may include a High-Definition Multimedia Interface (HDMI) 372, a Universal Serial Bus (USB) 374, an optical interface 376, or a D-subminiature (D-sub) 378.

The interface 370 may be included in the communication interface 270 illustrated in FIG. 2. Additionally or alternatively, the interface 370 may include a mobile high-definition link (MHL) interface, a secure digital (SD) card/multimedia card (MMC) interface, or an infrared data association (IrDA) interface.

The audio module 380 bilaterally converts a sound and an electrical signal. At least some elements of the audio module 380 may be included in the input/output interface 245 illustrated in FIG. 2. The audio module 380 processes sound information that is input or output through a plurality of speakers 382, a receiver 384, earphones 386, the microphone 388, or the like.

According to an embodiment, the plurality of speakers 382 includes a first speaker outputting a sound signal and a second speaker outputting an attenuation signal for cancelling at least a part of an echo component by the sound signal. The second speaker may output an attenuation signal having a volume smaller than a reference volume in a position adjacent to the microphone 388.

The camera module 391 is a device which photographs a still image and a moving image. According to an embodiment, the camera module 291 may include one or more image sensors (for example, a front sensor or a back sensor), a lens, an Image Signal Processor (ISP) or a flash (for example, LED or xenon lamp).

The power management module 395 manages the power of the electronic device 301. According to an embodiment, the power management module 395 may include a power management integrated circuit (PMIC), a charger integrated circuit (IC), or a battery gauge. The PMIC may have a wired and/or wireless charging scheme. Examples of the wireless charging method include a magnetic resonance method, a magnetic induction method, an electromagnetic method, and the like. Additional circuits (e.g., a coil loop, a resonance circuit, a rectifier, etc.) for wireless charging may be further included. The battery gauge measures a residual quantity, a voltage, a current, or a temperature during the charging of the battery 396.

The battery 396 may include a rechargeable battery and/or a solar battery. According to an embodiment, the battery 396 may include a plurality of cells that can be connected in series or in parallel.

The indicator 397 displays a particular state (for example, a booting state, a message state, a charging state, or the like) of the electronic device 301 or a part (for example, the processor 310) of the electronic device 301.

The motor 398 converts an electrical signal into mechanical vibration, and generates vibration, a haptic effect, or the like. The electronic device 301 may include a processing unit (for example, a GPU) for supporting a mobile television (TV). The processing unit for supporting mobile TV may processes media data according to a certain standard such as digital multimedia broadcasting (DMB), digital video broadcasting (DVB), or mediaFlo™.

Each of the above-described component elements of hardware according to the present disclosure may be configured with one or more components, and the names of the corresponding component elements may vary based on the type of electronic device. The electronic device may include at least one of the aforementioned elements. Some elements may be omitted or other additional elements may be further included in the electronic device. Also, some of the hardware components may be combined into one entity, which may perform functions identical to those of the relevant components before the combination.

Figure 4:
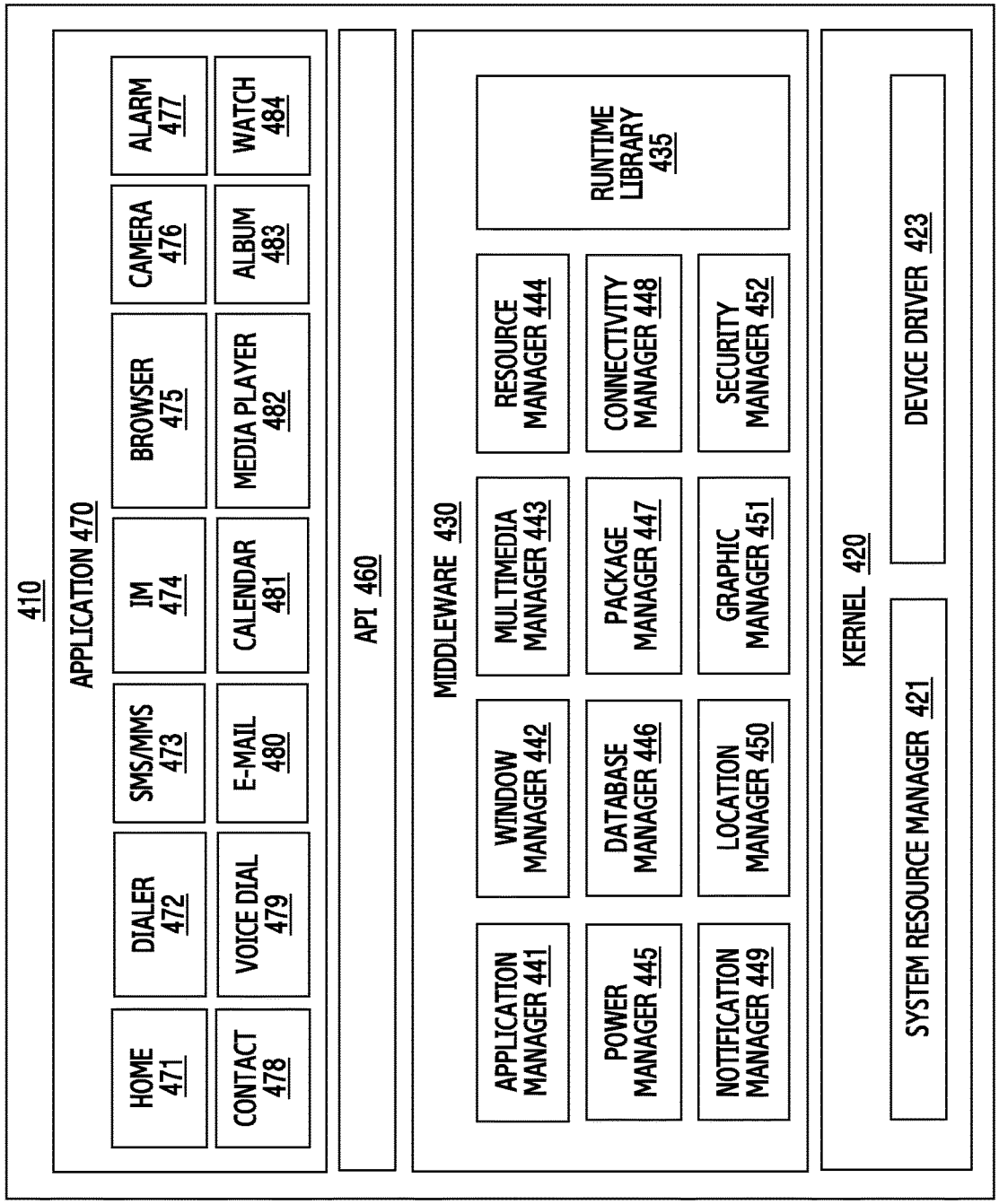
FIG. 4 is a block diagram of a program module, according to an embodiment of the present disclosure.

FIG. 4 is a block diagram of a program module, according to an embodiment of the present disclosure.

Referring to FIG. 4, a program module 410 is provided. The program module 410 includes an OS for controlling resources related to the electronic device 201 and/or the application 247 executed in the operating system. The operating system may be Android, iOS, Windows, Symbian, Tizen, Bada, or the like.

The program module 410 includes a kernel 420, middleware 430, an Application Programming Interface (API) 460, and/or applications 470. At least some of the program module 410 may be preloaded on the electronic device 201, or may be downloaded from the external electronic devices 202 or 204, or the server 206.

The kernel 420 includes a system resource manager 421 and/or a device driver 423.

The system resource manager 421 performs the control, allocation, retrieval, or the like of system resources. According to an embodiment, the system resource manager 421 may include a process manager, a memory manager, a file system manager, or the like. The device driver 423 may include a display driver, a camera driver, a Bluetooth driver, a shared memory driver, a USB driver, a keypad driver, a Wi-Fi driver, an audio driver, or an Inter-Process Communication (IPC) driver.

The middleware 430 provides a function commonly required by the applications 470, or provides various functions to the applications 470 through the API 460 so that the applications 470 can efficiently use limited system resources within the electronic device. According to an embodiment, the middleware 430 includes at least one of a runtime library 435, an application manager 441, a window manager 442, a multimedia manager 443, a resource manager 444, a power manager 445, a database manager 446, a package manager 447, a connectivity manager 448, a notification manager 449, a location manager 450, a graphic manager 451, and a security manager 452.

The runtime library 435 includes a library module which a compiler uses in order to add a new function through a programming language while the applications 470 are being executed. The runtime library 435 performs input/output management, memory management, the functionality for an arithmetic function, or the like.

The application manager 441 manages a life cycle of at least one of the applications 470.

The window manager 442 manages Graphical User Interface (GUI) resources used for the screen.

The multimedia manager 443 determines a format required to reproduce various media files, and may encode or decode a media file by using a coder/decoder (codec) appropriate for the corresponding format.

The resource manager 444 manages resources, such as a source code, a memory, a storage space, and the like of at least one of the applications 470.

The power manager 445 operates together with a basic input/output system (BIOS) to manage a battery or power, and provides power information required for the operation of the electronic device. According to an embodiment, the power manager 445 may make a control to wirelessly or by wire provide charge and discharge of the battery.

The database manager 446 generates, searches for, and/or changes a database to be used by at least one of the applications 470.

The package manager 447 manages the installation or update of an application distributed in the form of a package file.

The connectivity manager 448 manages a wireless connection such as Wi-Fi or Bluetooth.

The notification manager 449 displays or notifies of an event, such as an arrival message, an appointment, a proximity notification, and the like, in such a manner as not to disturb the user.

The location manager 450 manages location information of the electronic device.

The graphic manager 451 manages a graphic effect, which is to be provided to the user, or a user interface related to the graphic effect.

The security manager 452 provides various security functions required for system security, user authentication, and the like.

According to an embodiment, when the electronic device (for example, the electronic device 201) has a telephone call function, the middleware 430 may further include a telephony manager for managing a voice call function or a video call function of the electronic device.

The middleware 430 may include a middleware module that forms a combination of various functions of the above-described elements. The middleware 430 may provide a module specialized for each type of OS in order to provide a differentiated function. Also, the middleware 430 may dynamically delete some of the existing elements, or may add new elements.

The API 460 is a set of API programming functions, and may be provided with a different configuration according to an OS. For example, in the case of Android or iOS, one API set may be provided for each platform. In the case of Tizen, two or more API sets may be provided for each platform.

The applications 470 may include one or more applications which can provide functions such as home 471, dialer 472, SMS/MMS 473, instant message (IM) 474, browser 475, camera 476, alarm 477, contacts 478, voice dialer 479, email 480, calendar 481, media player 482, album 483, clock 484, health care (for example, measure exercise quantity or blood sugar levels), or environment information (for example, atmospheric pressure, humidity, or temperature information).

According to an embodiment, the applications 470 may include an information exchange application for supporting information exchange between the electronic device 201 and the electronic devices 202 and 204. The information exchange application may include a notification relay application for transferring specific information to an external electronic device or a device management application for managing an external electronic device.

The notification relay application may include a function of transferring, to the external electronic devices 202 and 204, notification information generated from other applications of the electronic device 201 (for example, an SMS/MMS application, an e-mail application, a health management application, or an environmental information application). Further, the notification relay application can receive notification information from the external electronic device and provide the received notification information to a user.

The device management application manages (for example, installs, deletes, or updates) at least one function of the external electronic devices 202 and 204 communicating with the electronic device (for example, a function of turning on/off the external electronic device itself (or some components) or a function of adjusting luminance (or a resolution) of the display), applications operating in the external electronic device, or services provided by the external electronic device (for example, a communication service and a message service).

According to an embodiment, the applications 470 may include applications (for example, a health care application of a mobile medical appliance or the like) designated according to attributes of the external electronic device 202 or 204. The application 470 may include an application received from the server 206 or the electronic devices 202 and 204. The application 470 may include a preloaded application or a third party application which can be downloaded from the server.

Names of the elements of the program module 410, according to the above-described embodiments of the present disclosure, may change depending on the type of OS.

According to various embodiments of the present disclosure, at least some of the program module 410 may be implemented in software, firmware, hardware, or a combination of two or more thereof. At least some of the program module 410 may be implemented (e.g., executed) by the processor 310. At least some of the program module 410 may include a module, a program, a routine, a set of instructions, and/or a process for performing one or more functions.

According to various embodiments of the present disclosure, the electronic device includes a housing; at least one microphone; a plurality of speakers; and a circuit included in the housing and electrically connected to the at least one microphone and the plurality of speakers, wherein the circuit may be configured to receive a first digital signal related to a sound, convert the received first digital signal into a first analog signal, output the first analog signal as a first sound using at least a part of the plurality of speakers, filter at least one of at least a part of the first analog signal and at least a part the output first sound to generate a second analog signal, obtain at least a part of the output first sound using the at least one microphone, convert the at least a part of the output first sound into a third analog signal, and cancel at least a first part of the third analog signal using the second analog signal.

According to various embodiments, the circuit is configured to filter at least a part of the first digital signal to generate a second digital signal, convert the at least the first part of the third analog signal into a third digital signal, and cancel at least a part of the third digital signal using the filtered second digital signal.

According various embodiments, the circuit is configured to output the second analog signal as a second sound using the at least another part of the plurality of speakers, obtain at least a part of the output of the second sound using the at least one microphone.

According to various embodiments, the second analog signal includes a signal obtained by filtering, based on at least a second part of the third analog signal, a signal which is obtained by inverting at least the part of the first analog signal.

According to various embodiments, the circuit is configured to invert the at least a part of the first analog signal, filter the inverted signal based on at least one of a noise component and delay distortion information included in the third analog signal, and then generate the second analog signal.

According to various embodiments, at least the other part of the plurality of speakers may be arranged adjacent to the at least one microphone.

According to various embodiments, the second analog signal includes the signal which is obtained by inverting at least a part of the first analog signal.

According to various embodiments, the circuit is configured to determine whether the at least the first part of the third analog signal can be cancelled based on the second analog signal, when it is determined that the at least the first part of the third analog signal cannot be cancelled based on the second analog signal, filter the second analog signal using at least a second part of the third analog signal, and cancel the at least the first part of the third analog signal using the filtered second analog signal.

According to various embodiments, the at least the first part of the third analog signal includes an echo component by the output first sound.

According to various embodiments, the electronic devices further includes a processor in the housing, and a memory electrically connected to the processor, wherein, while running, the memory may store instructions which allow the processor to obtain an external sound using the at least one microphone and perform voice recognition based on the external sound.

According to various embodiments, the instructions control the processor to determine whether a voice recognition mode is activated while a communication service is provided, and generate the second analog signal in response to activation of the voice recognition mode.

Figure 5:
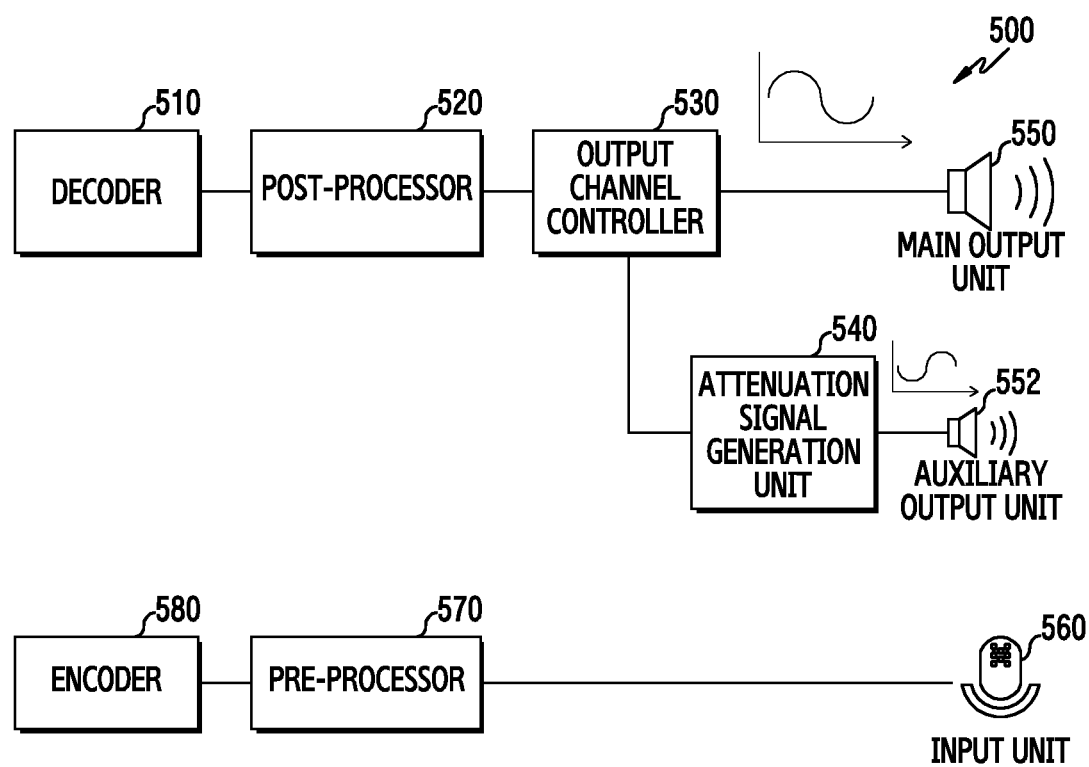
FIG. 5 is a block diagram of an electronic device for cancelling an echo using an inverted phase of an output signal, according to an embodiment of the present disclosure.

FIG. 5 is a block diagram of an electronic device for cancelling echo using an inverted phase of an output signal, according to an embodiment of the present disclosure. For example, an electronic device 500 illustrated in FIG. 5 includes all or some of the electronic device 201 illustrated in FIG. 2.

Referring to FIG. 5, the electronic device 500 may include an audio output module and/or audio input module.

The audio output module of the electronic device 500 includes a decoder 510, a post-processor 520, an output channel controller 530, an attenuation signal generation unit 540 (e.g., including attenuation signal generation circuitry), a main output unit 550 (e.g., including main output circuitry), and an auxiliary output unit 552 (e.g., including auxiliary output circuitry).

The decoder 510 decodes an encoded a sound signal to be output through the main output unit 550. For example, the decoder 510 converts a compressed sound signal into raw data. The sound signal to be output through the main output unit 550 may include a sound signal provided from an external device (e.g., external electronic devices 202 and 204) through a communication interface (e.g., the communication interface 270), or an audio signal stored in a memory (e.g., the memory 230).

The post-processor 520 performs a post-process for a sound signal decoded in the decoder 510 so as to output the sound signal through the main output unit 550. For example, the post-processor 520 performs a post-process, such as sound adjustment, a dynamic range control (DRC), and noise cancellation, for the sound signal decoded in the decoder 510. The post-processor 520 cancels white noise included in the sound signal through the noise cancellation.

The output channel controller 530 designates a channel for outputting the sound signal so as to enable the sound signal to be reproduced through the main output unit 550. The output channel controller 530 provides the sound signal to be output through the main output unit 550 to the attenuation signal generation unit 540.

The main output unit 550 converts the sound signal provided from the output channel controller 530 into an analog signal to output the analog signal outside. The main output unit 550 may include the first speaker 282 in FIG. 2.

The attenuation signal generation unit 540 inverts a phase of the sound signal provided from the output channel controller 530 to generate the attenuation signal. For example, the attenuation signal generation unit 540 generates the inverted phase signal of the sound signal provided from the output channel controller 530. The attenuation signal generation unit 540 makes a control to maintain synchronization of the inverted phase signal and the sound signal output through the main output unit 550.

The auxiliary output unit 552 converts the attenuation signal provided from the attenuation signal generation unit 540 into an analog signal to output the analog signal outside. The auxiliary output unit 552 may include the second speaker 284 in FIG. 2. The auxiliary output unit 552 may be adjacent to an input unit 560 (e.g., a microphone), and outputs an attenuation signal with a small volume. Herein, the small volume is a volume within a predetermined reference volume range which does not affect the sound signal output through the main output unit 550.

According to an embodiment, the audio input module may further include the input unit 560, a pre-processor 570, and an encoder 580.

The input unit 560 collects the sound signal. For example, the input unit 560 corresponds to the microphone 286 shown in FIG. 2, and collects a voice signal of a user and then converts the voice signal into a digital signal. Additionally, the input unit 560 collects an environment noise together with the sound signal. The electronic device 500 outputs an inverted phase signal of the sound signal output through the main output unit 550 so that it can be attenuated or cancelled such that an echo component flows in to the input unit 560.

The pre-processor 570 performs pre-processing for a sound signal collected through the input unit 560. For example, the pre-processor 570 performs a pre-process, such as volume adjustment, a DRC, noise cancellation, and echo cancellation for the sound signal provided from the input unit 560. For example, the pre-processor 570 cancels at least a part of the environment noise included in the sound signal through the noise cancellation. For example, the pre-processor 570 cancels at least a part of the echo component included in the sound signal through the echo cancellation.

The encoder 580 encodes (compresses) the sound signal pre-processed in the pre-processor 570 according to a specific encoding scheme. For example, the encoder 580 compresses raw data provided from the pre-processor 570 according to the specific encoding scheme and then transmits the raw data to a corresponding application (e.g., a communication application) or stores the raw data in a memory (e.g., the memory 230).

Figure 6:
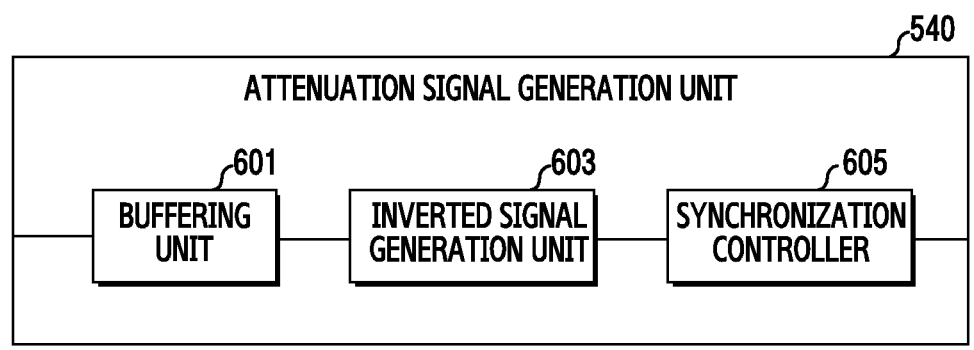
FIG. 6 is a block diagram of an attenuation signal generation unit for generating an attenuation signal corresponding to an output signal, according to an embodiment of the present disclosure.

FIG. 6 is a block diagram of an attenuation signal generation unit for generating an attenuation signal corresponding to an output signal, according to an embodiment of the present disclosure. Hereinafter, a detailed configuration of the attenuation signal generation unit 540 shown in FIG. 5 will be described.

Referring to FIG. 6, the attenuation signal generation unit 540 shown in FIG. 5 includes a buffering unit 601 (e.g., including buffering circuitry), an inverted signal generation unit 603 (e.g., including inverted signal generation circuitry), and a synchronization controller 605.

The buffering unit 601 temporarily buffers the sound signal provided from the output channel controller 530 shown in FIG. 5.

The inverted signal generation unit 603 inverts a phase of the sound signal buffered in the buffering unit 601 to generate an inverted phase signal of the sound signal to be output through the main output unit 550.

The synchronization controller 605 makes a control to compensate for a time difference between the inverted phase signal generated in the inverted signal generation unit 603 and the sound signal output through the main output unit 550, and then outputs the inverted phase signal through the auxiliary output unit 552 shown in FIG. 5. The synchronization controller 605 stores, in a buffer of the synchronization controller 605, the inverted phase signal generated in the inverted signal generation unit 603. The synchronization controller 605 compensates for a time difference between an inverted phase signal buffered in the buffer of the synchronization controller 605 and the sound signal output through the main output unit 550. For example, the synchronization controller 605 selects an inverted phase signal corresponding to the sound signal output through the main output unit 550 among the inverted phase signals buffered in the buffer of the synchronization controller 605. The synchronization controller 605 makes a control to output, through the auxiliary output unit 552, the inverted phase signal corresponding to the sound signal output through the main output unit 550. For example, the synchronization controller 605 compensates for a time difference between the sound signal output through the main output unit 550 and the sound signal buffered in the buffering unit 601.

According to various embodiments, the attenuation signal generation unit 540 changes the positions of the buffering unit 601 and the inverted signal generation unit 603. For example, the attenuation signal generation unit 540 of the inverted signal generation unit 603 generates the inverted phase signal of the sound signal provided from the output channel controller 530 shown in FIG. 5. The buffering unit 601 may temporarily buffer the inverted phase signal generated in the inverted phase generation unit 603. The synchronization controller 605 compensates for a time difference between the sound signal output through the main output unit 550 and an inverted phase signal buffered in the buffering unit 601. The synchronization controller 605 selects an inverted phase signal corresponding to the sound signal output through the main output unit 550 among the inverted phase signals buffered in the buffering unit 601. The synchronization controller 605 makes a control to output, through the auxiliary output unit 552, the inverted phase signal corresponding to the sound signal output through the main output unit 550.

Figure 7:
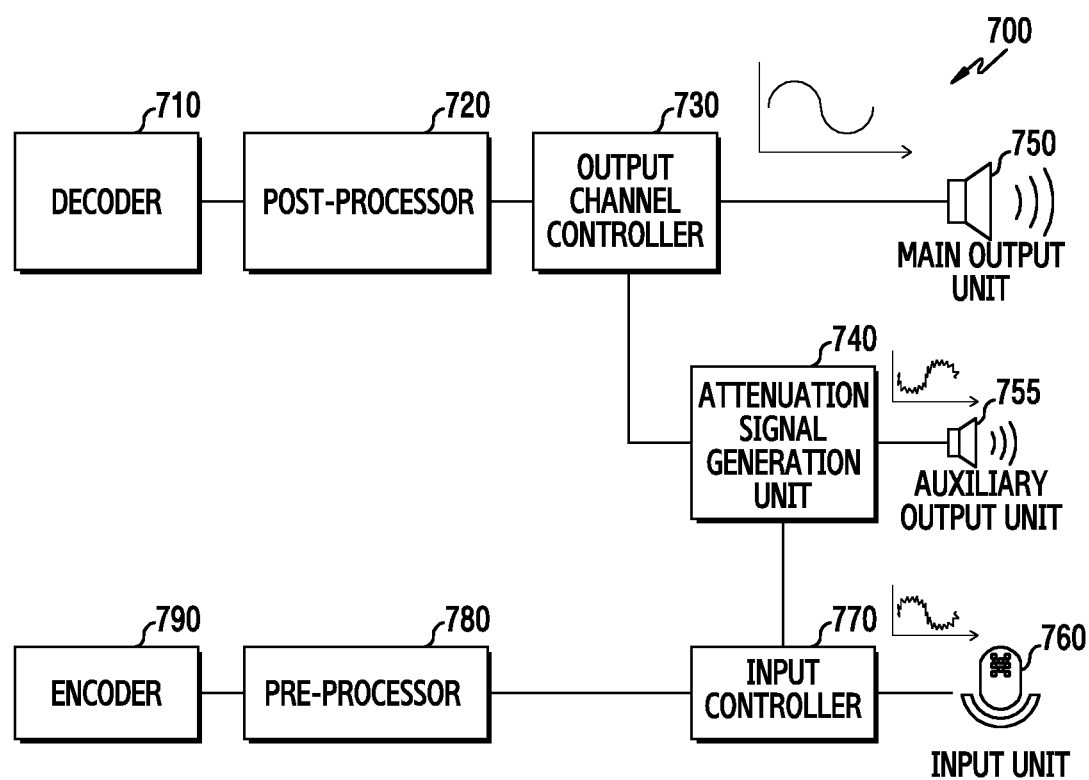
FIG. 7 is a block diagram of an electronic device for cancelling an echo using an attenuation signal corresponding to an external environment parameter, according to an embodiment of the present disclosure.

FIG. 7 is a block diagram of an electronic device for cancelling echo using an attenuation signal corresponding to an external environment parameter, according to an embodiment of the present disclosure. For example, an electronic device 700 shown in FIG. 7 includes all or a part of the electronic device 201 shown in FIG. 2 or the electronic device 500 shown in FIG. 5.

Referring to FIG. 7, the electronic device 700 includes an audio output module and/or audio input module.

The audio output module of the electronic device 700 includes a decoder 710, a post-processor 720, an output channel controller 730, an attenuation signal generation unit 740, a main output unit 750, and an auxiliary output unit 755.

According to an embodiment, the decoder 710, the post-processor 720, the output channel controller 730, a main output unit 750, and the auxiliary output unit 755, which are included in the audio output module of FIG. 7, may be operated correspondingly to the decoder 510, the post-processor 520, the output channel controller 530, a main output unit 550, and the auxiliary output unit 552, which are included the audio output module of FIG. 5. For example, the decoder 710 decodes an encoded sound signal to be output through the main output unit 750. The post-processor 720 performs a post-process for a sound signal decoded in the decoder 710 so as to output the sound signal through the main output unit 750. The output channel controller 730 designates a channel of a sound signal to be output through the main output unit 750 and provides the sound signal to be output through the main output unit 750 to the attenuation signal generation unit 740. The main output unit 750 may be an example of the first speaker 282 of FIG. 2, and converts the sound signal provided from the output channel controller 730 into an analog signal to output the analog signal externally. The auxiliary output unit 752 may be an example of the second speaker 284 of FIG. 2, and converts the attenuation signal generated from the attenuation signal generation unit 740 into an analog signal to output the analog signal externally.

The attenuation signal generation unit 740 generates an attenuation signal for attenuating an echo component of the sound signal output through the main output unit 750 based on a sound signal and/or external environment element provided from the output channel controller 730. For example, the attenuation signal generation unit 740 generates the inverted phase signal of the sound signal provided from the output channel controller 730. The attenuation signal generation unit 740 detects an external environment parameter in a microphone input signal provided from an input controller 770 of the audio input module. The attenuation signal generation unit 740 generates the attenuation signal by filtering an inverted phase signal of the sound signal based on the external environment parameter. That is, the attenuation signal generation unit 740 generates the attenuation signal by pre-distorting the inverted phase signal to correspond to the external environment parameter in order to attenuate an echo component transformed based on the external environment parameter. For example, the attenuation signal generation unit 740 detects an external environment parameter to be applied to the attenuation signal based on the microphone input signal distorted due to an effect of the external environment parameter. Herein, the external environment parameter may include a noise, a signal distortion caused by delay, and the like.

According to an embodiment, the audio input module may further include the input unit 760, the input controller 770, a pre-processor 780, and an encoder 790.

According to an embodiment, the input unit 760, the pre-processor 780, and the encoder 790, included in the audio input module of FIG. 7, may correspond to the input unit 560, the pre-processor 570, and the encoder 580, included in the audio input module of FIG. 5. For example, the input unit 760 corresponds to the microphone 286 shown in FIG. 2, and collects a sound signal of a user and then convert the sound signal into a digital signal. The pre-processor 780 performs a pre-process for the microphone input signal provided from the input controller 770. The encoder 790 encodes (compresses) the sound signal pre-processed in the pre-processor 780 according to a specific encode scheme.

The input controller 770 provides the sound signal collected through the input unit 760 to the pre-processor 780 and the attenuation signal generation unit 740.

Figure 8:
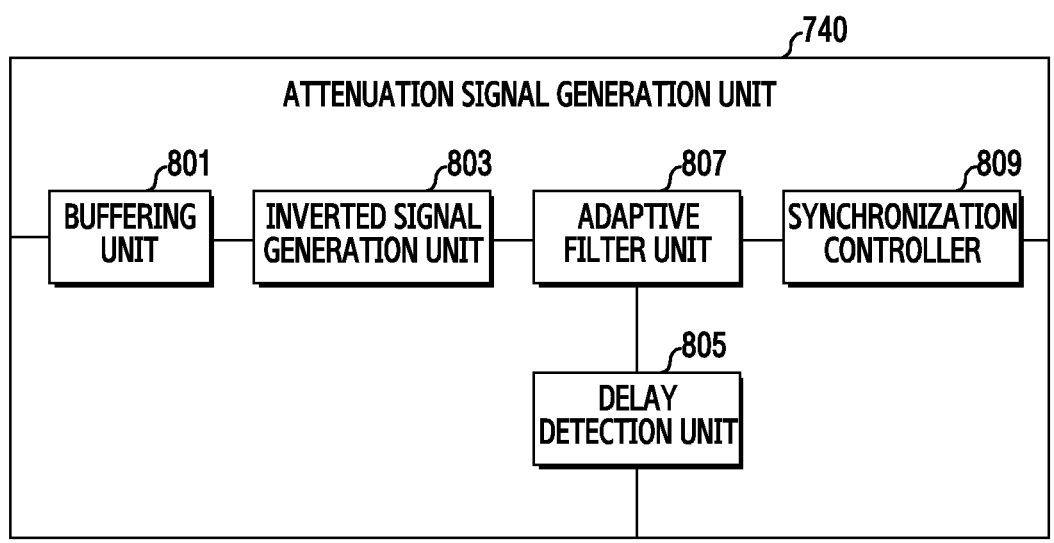
FIG. 8 is a block diagram of an attenuation signal generation unit for generating an attenuation signal corresponding to an external environment parameter, according to an embodiment of the present disclosure.

FIG. 8 is a block diagram of an attenuation signal generation unit for generating an attenuation signal corresponding to an external environment parameter, according to an embodiment of the present disclosure. Hereinafter, a detailed configuration of the attenuation signal generation unit 740 shown in FIG. 7 will be described.

Referring to FIG. 8, the attenuation signal generation unit 740 shown in FIG. 7 includes a buffering unit 801, an inverted signal generation unit 803, a delay detection unit 805, an adaptive filter unit 807, and/or a synchronization controller 809.

The buffering unit 801 temporarily buffers the sound signal provided from the output channel controller 730 shown in FIG. 7.

The inverted signal generation unit 803 generates an inverted phase signal of the sound signal buffered in the buffering unit 801.

The delay detection unit 805 detects an echo path delay (EPD) of an echo signal collected through the input unit 760. For example, the delay detection unit 805 detects a delay time of a sound signal output through the main output unit 750 which flows in to the input unit 760 as the echo component in order to detect the sound signal output through the main output unit 750 corresponding to a microphone input signal collected through the input unit 760.

The adaptive filter unit 807 filters the inverted phase signal generated in the inverted signal generation unit 803 to correspond to the external environment parameter. For example, the adaptive filter unit 807 detects the external environment parameter included in the sound signal collected through the input unit 760 based on the delay time information provided from the delay detection unit 805. The adaptive filter unit 807 detects the sound signal output through the main output unit 750 corresponding to the microphone input signal collected through the input unit 760 based on the delay time detected from the delay detection unit 805. The adaptive filter unit 807 compares the microphone input signal and the detected sound signal and then detects distortion information of a signal by the external environment parameter. For example, the adaptive filter unit 807 pre-distorts the inverted phase signal generated from the inverted signal generation unit 803 to correspond to the distortion information of the signal by the external environment parameter, thereby generating an attenuation signal.

The adaptive filter unit 807 attenuates a size of the inverted phase signal generated from the inverted signal generation unit 803 to correspond to the distortion information of the signal by the external environment parameter.

The synchronization controller 809 makes a control to compensate for a time difference between the attenuation signal generated in the adaptive filter unit 807 and the sound signal output through the main output unit 750 and then outputs the attenuation signal through the auxiliary output unit 752 shown in FIG. 7. The synchronization controller 809 may buffer, in a buffer of the synchronization controller 809, the attenuation signal generated in the adaptive filter unit 807. The synchronization controller 809 compensates for a time difference between the attenuation signal buffered in the buffer of the synchronization controller 809 and the sound signal output through the main output unit 750. The synchronization controller 809 makes a control to output the attenuation signal through the auxiliary output unit 752 by selecting an attenuation signal corresponding to the sound signal output through the main output unit 750 among the attenuation signals buffered in the buffer of the synchronization controller 809. The synchronization controller 809 compensates for a time difference between the sound signal output through the main output unit 750 and the sound signal buffered in the buffering unit 801.

The attenuation signal generation unit 740 changes positions of the buffering unit 801 and the inverted signal generation unit 803. For example, the attenuation signal generation unit 740 of the inverted signal generation unit 803 generates the inverted phase signal of the sound signal provided from the output channel controller 730 shown in FIG. 7. The buffering unit 801 temporarily buffers the inverted phase signal generated in the inverted phase generation unit 803. The synchronization controller 809 compensates for a time difference between the sound signal output through the main output unit 750 and an inverted phase signal buffered in the buffering unit 801. The synchronization controller 809 selects an inverted phase signal corresponding to the sound signal output through the main output unit 750 among the inverted phase signals buffered in the buffering unit 801. The synchronization controller 809 makes a control to output, through the auxiliary output unit 752, the inverted phase signal corresponding to the sound signal output through the main output unit 750.

Figure 9:
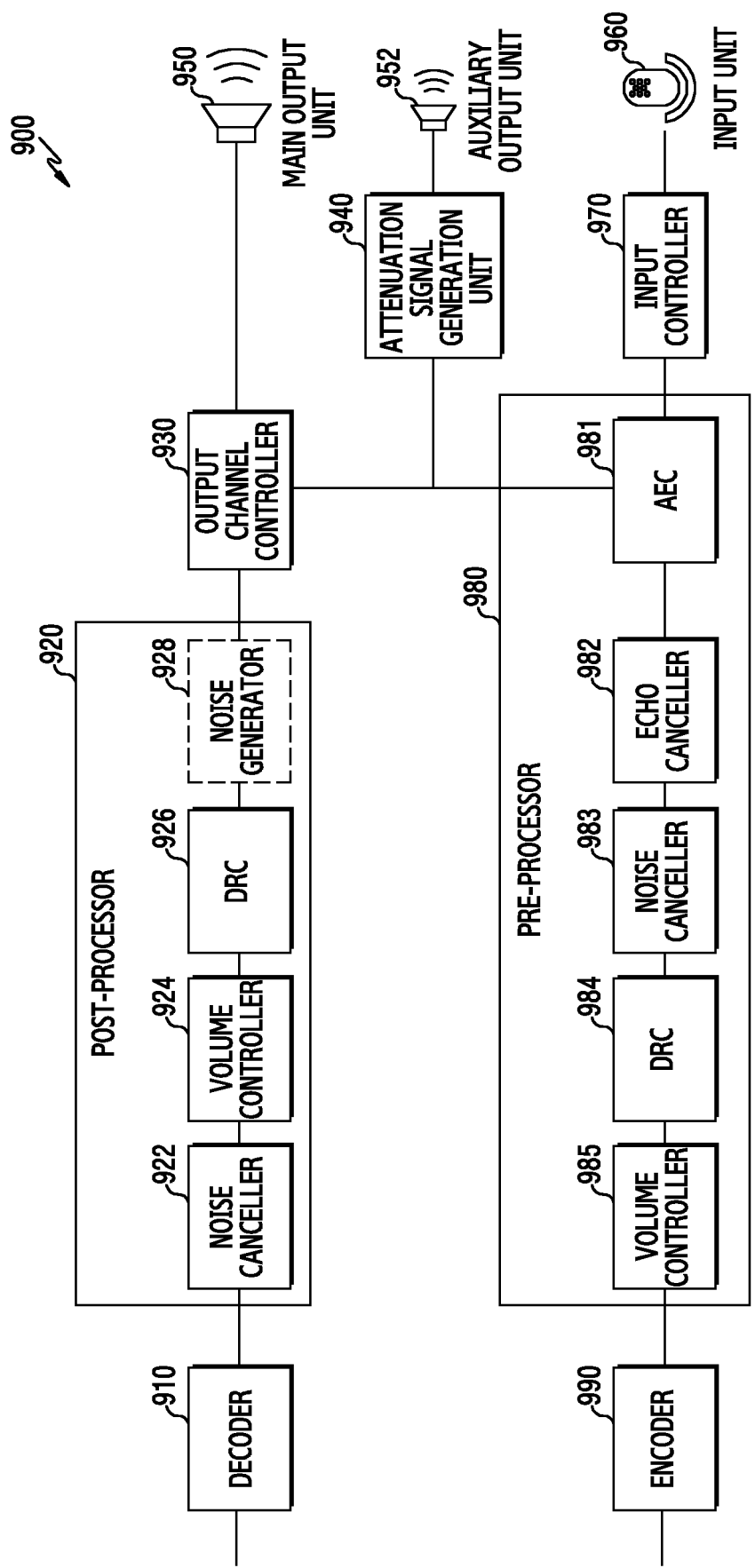
FIG. 9 is a block diagram illustrating an electronic device for cancelling an echo component, according to an embodiment of the present disclosure.

FIG. 9 is a block diagram illustrating an electronic device for cancelling an echo component, according to an embodiment of the present disclosure. A configuration for additionally cancelling an echo component using an AEC by the electronic device 700 of FIG. 7 will be described below. Hereinafter, a decoder 910, a post-processor 920, an output channel controller 930, an attenuation signal generation unit 940, a main output unit 950, an auxiliary output unit 952, an input unit 960, an input controller 970, a pre-processor 980, and an encoder 990 of an electronic device 900, which are shown in FIG. 9, may be operated correspondingly to the decoder 710, the post-processor 720, the output channel controller 730, the attenuation signal generation unit 740, the main output unit 750, the auxiliary output unit 752, the input unit 760, the input controller 770, the pre-processor 780, and the encoder 790 of the electronic device 700, shown in FIG. 7, so that a detailed operation of each component of the electronic device 900 will be omitted.

Referring to FIG. 9, the electronic device 900 cancels at least a part of an echo component which flows in through the input unit 960 using an AEC 981 included in the pre-processor 980. For example, the output channel controller 930 provides a sound signal (digital signal) to be output through the main output unit 950 to the AEC 981 of the pre-processor 980.

The AEC 981 cancels at least a part of an echo component included in the microphone input signal provided from the input controller 970 with reference to the sound signal provided from the output channel controller 930. For example, the AEC 981 may configure the sound signal provided from the output channel controller 930 as echo reference data. The AEC 981 cancels at least a part (e.g., the echo component) having a frequency characteristic similar to the echo reference data of the microphone input signal, through a frequency analysis for the microphone input signal provided from the input controller 970. Additionally, the AEC 981 updates the echo reference data to correspond to an external environment parameter. The AEC 981 cancels the at least a part of the echo component included in the microphone input signal provided from the input controller 970 based on the updated echo reference data.

The post-processor 920 of the electronic device 900 includes a noise canceller (suppressor) 922, a volume controller (equalizer, volume) 924, and a DRC 926. The noise canceller 922 cancels white noise included in a sound signal decoded in the decoder 910. The volume controller 924 controls the volume of a sound signal to be output through the main output unit 950. The volume controller 924 equalizes the sound signal to be output through the main output unit 950. The DRC 926 adjusts the amount of negative pressure to allow the size of the sound signal provided from the volume controller 924 to be limited to be in a regular level.

Additionally, the post-processor 920 may further include a noise generator 928. The noise generator 928 generates a noise to enable a user to recognize that a sound is being reproduced in a section in which the sound signal output through the main output unit 950 does not exist. For example, the noise generator 928 generates a noise to enable a user to recognize that the line is busy in a section in which the sound signal output through the main output unit 950 does not exist while providing a voice communication service.

The post-processor 980 of the electronic device 900 includes the AEC 981, the echo canceller (residual echo suppressor) 982, the noise canceller (suppressor) 983, the DRC 984, and the volume controller (equalizer, volume) 985. The echo canceller 982 cancels an echo component which is not cancelled through the AEC 981. For example, the echo canceller 982 may be omitted by cancelling the sound signal together with the echo component. The noise canceller 983 cancels an environment noise included in the microphone input signal collected through the input unit 960. The DRC 984 adjusts the amount of the negative pressure to allow the size of the sound signal provided from the noise canceller 983 to be limited to be in a regular level. The volume controller 985 makes a control to correspond to a size for outputting the volume of the sound signal collected through the input unit 960 from an external device. The volume controller 914 equally controls a frequency characteristic of the sound signal by equalizing the sound signal collected through the input unit 960.

Figure 10:
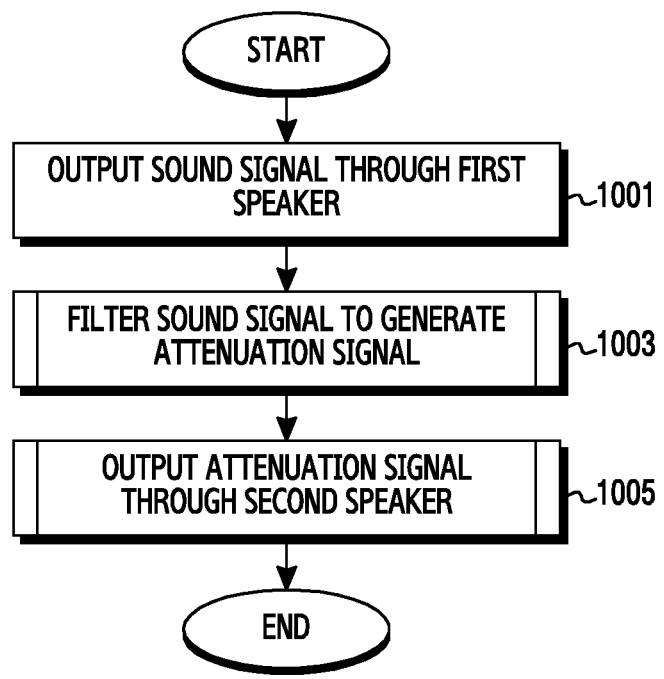
FIG. 10 is a flow chart illustrating a process of cancelling an echo component using an attenuation signal by an electronic device, according to an embodiment of the present disclosure.

FIG. 10 is a flow chart illustrating a process of cancelling an echo component using an attenuation signal by an electronic device, according to an embodiment of the present disclosure. Hereinafter, an operation for cancelling an echo component using the attenuation signal by the electronic device 500, 700, or 900 as shown in FIGS. 5, 7, and 9, respectively, will be described.

Referring to FIG. 10, in operation 1001, an electronic device may receive a sound signal from an external device or output, through the first speaker 282, a sound signal stored in a memory. For example, the electronic device 500 decodes, through the decoder 510, a sound signal provided from the external electronic devices 202 or 204, through the communication interface 270, or an audio signal stored in the memory 230. The electronic device 500 converts the sound signal decoded in the decoder 510 into an analog signal and then outputs the analog signal through the main output unit 550.

In operation 1003, the electronic device filters a sound signal output outside through the first speaker and then generates an attenuation signal for cancelling at least a part of echo by the sound signal. For example, the attenuation signal generation unit 540 of the electronic device 500 generates an attenuation signal by inverting a phase of the sound signal provided from the output channel controller 530. The attenuation signal generation unit 740 of the electronic device 700 detects an external environment parameter (e.g., a noise, a delay distortion, and the like) in the microphone input signal provided from the input controller 770. The attenuation signal generation unit 740 filters the inverted phase signal of the sound signal provided from the output channel controller 730 to correspond to an external environment element, thereby generating the attenuation signal.

In operation 1005, the electronic device outputs an attenuation signal for cancelling at least a part of the echo by the sound signal output outside through the first speaker, through the second speaker 284, externally. For example, the synchronization controller 605 of the electronic device 500 detects an output time point of the sound signal for the main output unit 550 (e.g., the first speaker 282). The synchronization controller 605 corrects an output time point of the attenuation signal based on the output time point of the sound signal and then outputs the attenuation signal through the auxiliary output unit 552 (e.g., the second speaker 284). The second speaker 284 may be configured to be adjacent to the microphone of the electronic device.

Figure 11:
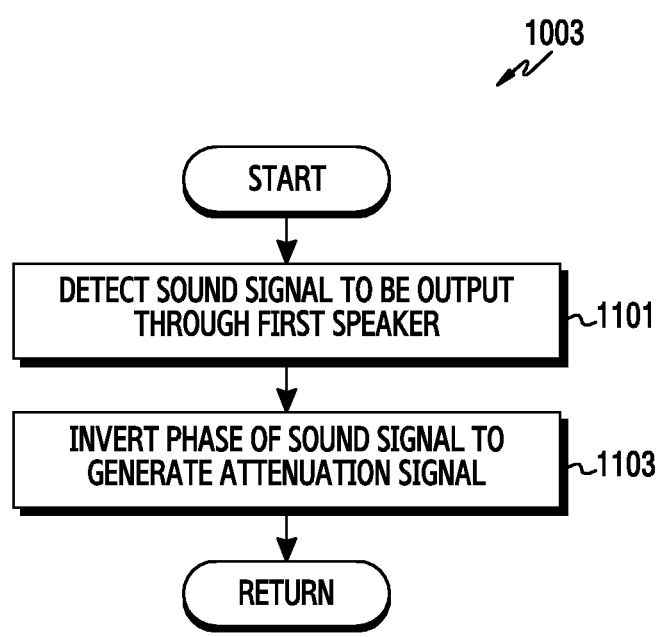
FIG. 11 is a flow chart illustrating a process of generating an attenuation signal corresponding to an output signal by an electronic device, according to an embodiment of the present disclosure.

FIG. 11 is a flow chart illustrating a process of generating an attenuation signal corresponding to an output signal by an electronic device, according to an embodiment of the present disclosure. Hereinafter, as shown in operation 1003 of FIG. 10, an operation for generating the attenuation signal by the electronic device 500, 700, or 900 as shown in FIGS. 5, 7, and 9, respectively, will be described.

Referring to FIG. 11, in operation 1101, an electronic device detects a sound signal to be output through the first speaker 282. For example, the attenuation signal generation unit 540 of the electronic device 500 buffers, in the buffering unit 601, a sound signal, which is provided from the output channel controller 530, to be output through the main output unit 550.

In operation 1103, the electronic device inverts the sound signal to be output through the first speaker and then generates an attenuation signal for cancelling at least a part of echo by the sound signal output externally, through the first speaker. For example, the attenuation signal generation unit 540 generates an inverted phase signal of the sound signal to be output through the main output unit 550 through the inverted signal generation unit 603.

Figure 12:
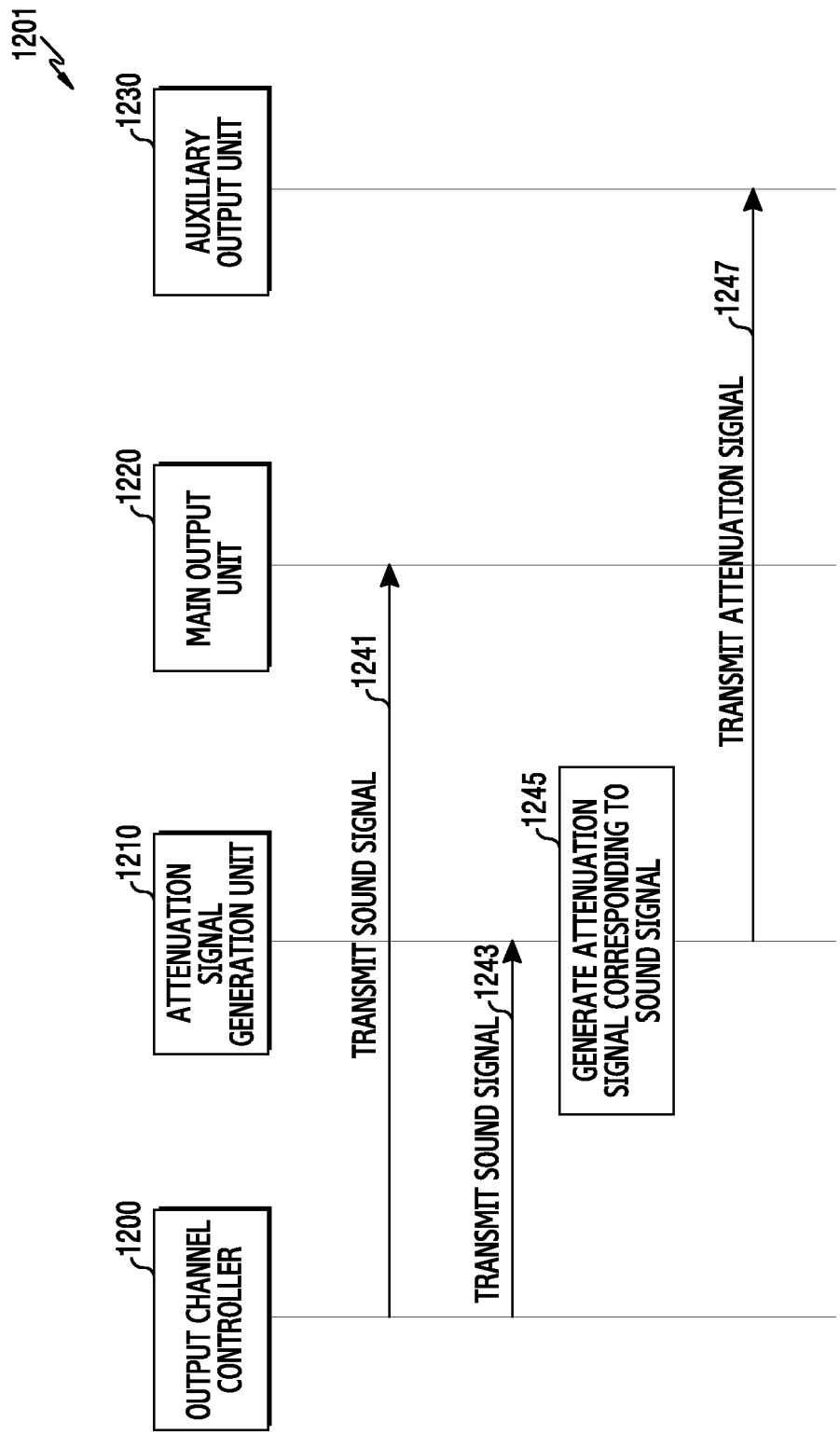
FIG. 12 is a signal flow diagram illustrating a process of generating an attenuation signal corresponding to an output signal by an electronic device, according to an embodiment of the present disclosure.

FIG. 12 is a signal flow diagram illustrating a process of generating an attenuation signal corresponding to an output signal by an electronic device, according to an embodiment of the present disclosure. Hereinafter, an operation for outputting the attenuation signal, which is generated in operation of FIG. 11, by the electronic device 500, 700, or 900 as shown in FIGS. 5, 7, and 9, respectively, will be described.

Referring to FIG. 12, an electronic device 1201 includes an output channel controller 1200 (e.g., the output channel controller 530 of FIG. 5), an attenuation signal generation unit 1210 (e.g., the attenuation signal generation unit 540), a main output unit 1220 (e.g., the main output unit 550), and an auxiliary output unit 1230 (e.g., the auxiliary output unit 560).

The output channel controller 1200 transmits, at operation 1241 and 1243, a sound signal to be output externally through the main output unit 1220 to the main output unit 1220 and the attenuation signal generation unit 1210, respectively. For example, the sound signal may include a voice signal received from the external electronic devices 202 or 204 or the server 206 or an audio signal stored in the memory 230.

The main output unit 1220 converts the sound signal provided from the output channel controller 1200 into an analog signal to output the analog signal outside.

The attenuation signal generation unit 1210 inverts a phase of the sound signal provided from the output channel controller 1200 and then generates an attenuation signal for cancelling at least a part of echo by the sound signal output through the main output unit 1220, at operation 1245. For example, the attenuation signal generation unit 1210 generates the inverted phase signal of the sound signal provided from the output channel controller 1200 and then stores the inverted phase signal in a memory (e.g. the buffering unit 601).

The attenuation signal generation unit 1210 transmits, at operation 1247, the attenuation signal to the auxiliary output unit 1230 to be synchronized with the sound signal output through the main output unit 1220. For example, the attenuation signal generation unit 1210 transmits, to the auxiliary output unit 1230, an attenuation signal corresponding to the sound signal to be output through the main output unit 1220.

The auxiliary output unit 1230 converts the attenuation signal provided from the attenuation signal generation unit 1210 into an analog signal to output the analog signal outside. For example, the auxiliary output unit 1230 outputs the attenuation signal with a small volume included in a pre-defined range not to affect the sound signal output through the main output unit 1220.

Figure 13:
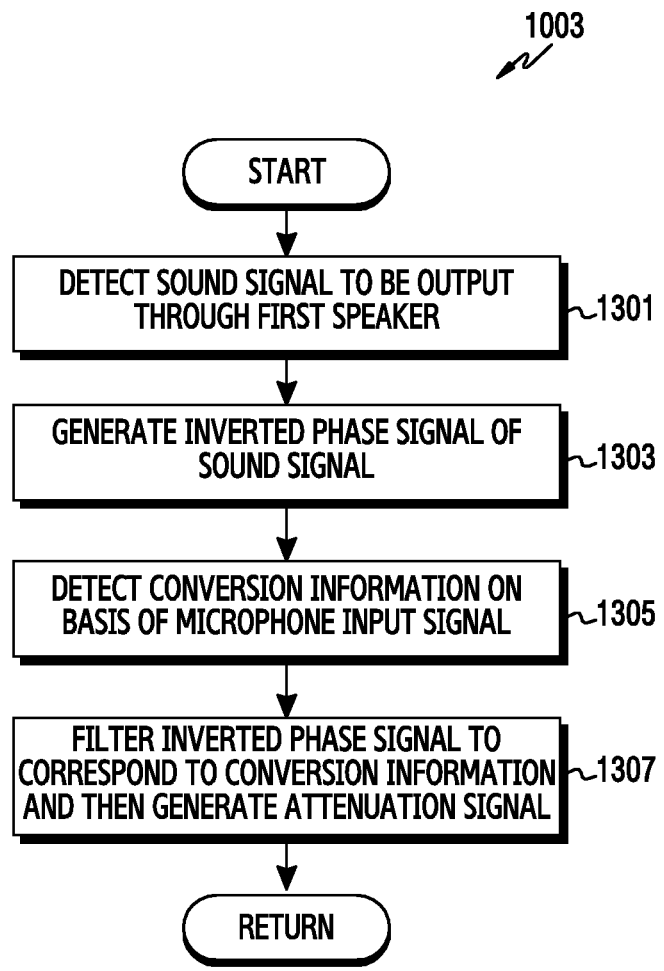
FIG. 13 is a flow chart illustrating a process of generating an attenuation signal corresponding to an external environment parameter by an electronic device, according to an embodiment of the present disclosure.

FIG. 13 is a flow chart illustrating a process of generating an attenuation signal corresponding to an external environment parameter by an electronic device, according to an embodiment of the present disclosure. Hereinafter, as shown in operation 1003 of FIG. 10, an operation for generating the attenuation signal by the electronic device 700 or 900 as shown in FIGS. 7 and 9, respectively, will be described.

Referring to FIG. 13, in operation 1301, an electronic device detects a sound signal to be output through the first speaker 282. For example, the output channel controller 730 of the electronic device 700 transmits the sound signal to be output through the main output unit 750 to the attenuation signal generation unit 740.

In operation 1303, the electronic device generates an inverted phase signal of a sound signal to be output through a first speaker. For example, the attenuation signal generation unit 740 inverts a phase of the sound signal to be output through the main output unit 750, through the inverted signal generation unit 803.

In operation 1305, the electronic device detects conversion information based on a microphone input signal. For example, the attenuation signal generation unit 740 detects an external environment parameter in a microphone input signal provided from an input controller 770. The attenuation signal generation unit 740 detects a sound signal corresponding to the microphone input signal collected through the input unit 760 of the sound signal output through the main output unit 750. The attenuation signal generation unit 740 compares the microphone input signal and the detected sound signal and then detects distortion information (conversion information) of a signal by the external environment parameter.

In operation 1307, the electronic device filters an inverted phase signal of a sound signal to correspond to the conversion information detected based on the microphone input signal, thereby generating the attenuation signal. For example, the attenuation signal generation unit 740 pre-distorts the inverted phase signal of the sound signal to correspond to the conversion information detected based on the microphone input signal, thereby generating the attenuation signal.

Figure 14:
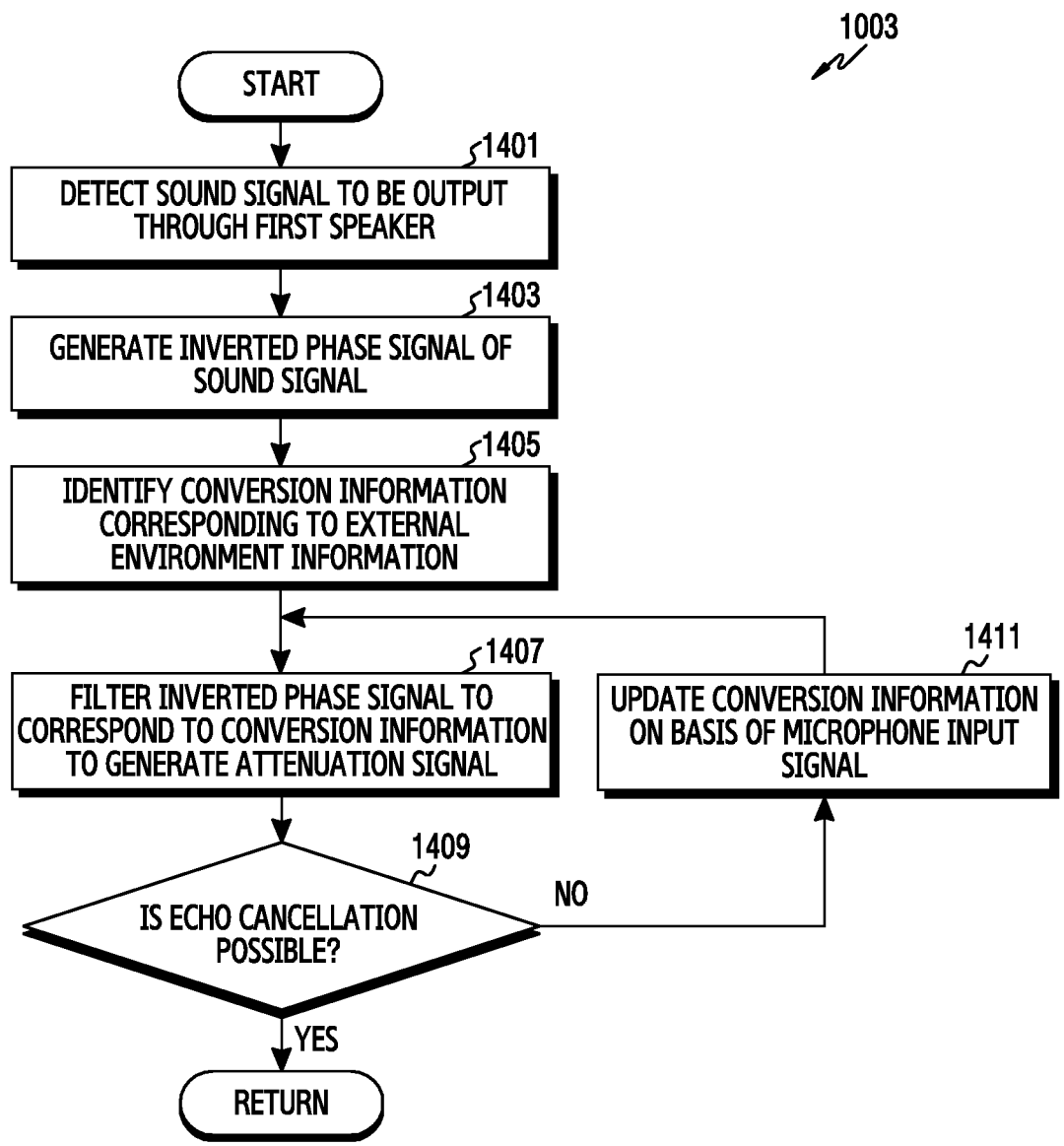
FIG. 14 is a flow chart illustrating a process of updating conversion information by an electronic device based on whether an echo is cancelled, according to an embodiment of the present disclosure.

FIG. 14 is a flow chart illustrating a process of updating conversion information by an electronic device based on whether an echo is cancelled, according to an embodiment of the present disclosure. Hereinafter, as shown in operation 1003 of FIG. 10, an operation for updating the conversion information and then generating the attenuation signal by the electronic device 700 or 900 as shown in FIGS. 7 and 9, respectively, will be described.

Referring to FIG. 14, in operation 1401, an electronic device detects a sound signal to be output through the first speaker 282. For example, the attenuation signal generation unit 740 of the electronic device 700 identifies a sound signal to be output through the main output unit 750 from the output channel controller 730.

In operation 1403, the electronic device generates an inverted phase signal of a sound signal to be output through a first speaker. For example, the inverted signal generation unit 803, shown in FIG. 8, inverts a phase of a sound signal to be output through the main output unit 750, which is stored in the buffering unit 801.

In operation 1405, the electronic device detects conversion information corresponding to an external environment parameter. For example, the attenuation signal generation unit 740 detects pre-defined conversion information and conversion information used to generate an attenuation signal at a previous time point.

In operation 1407, the electronic device filters the inverted phase signal of the sound signal and then generates the attenuation signal corresponding to the conversion information. For example, the adaptive filter unit 807, shown in FIG. 8, filters the inverted phase signal of the sound signal based on the pre-defined conversion information.

In operation 1409, the electronic device identifies whether an echo component of the sound signal can be cancelled based on the attenuation signal. For example, when the inverted phase signal, which is filtered and pre-distorted, overlaps with the sound signal collected through the input unit 760, the attenuation signal generation unit 740 identifies whether at least a part of the echo component of the sound signal collected through the input unit 760 is cancelled or the echo component is attenuated to be larger than or equal to a reference attenuate rate.

In operation 1411, when the echo component of the sound signal cannot be cancelled based on the attenuation signal, the electronic device updates conversion information based on a microphone input signal. For example, the attenuation signal generation unit 740 detects an external environment parameter in the microphone input signal collected through the input unit 760. The attenuation signal generation unit 740 updates conversion information used to generate the attenuation signal as conversion information corresponding to the external environment parameter.

The electronic device returns to step 1407 and filters the inverted phase signal of the sound signal and then generate the attenuation signal corresponding to the updated conversion information.

Figure 15:
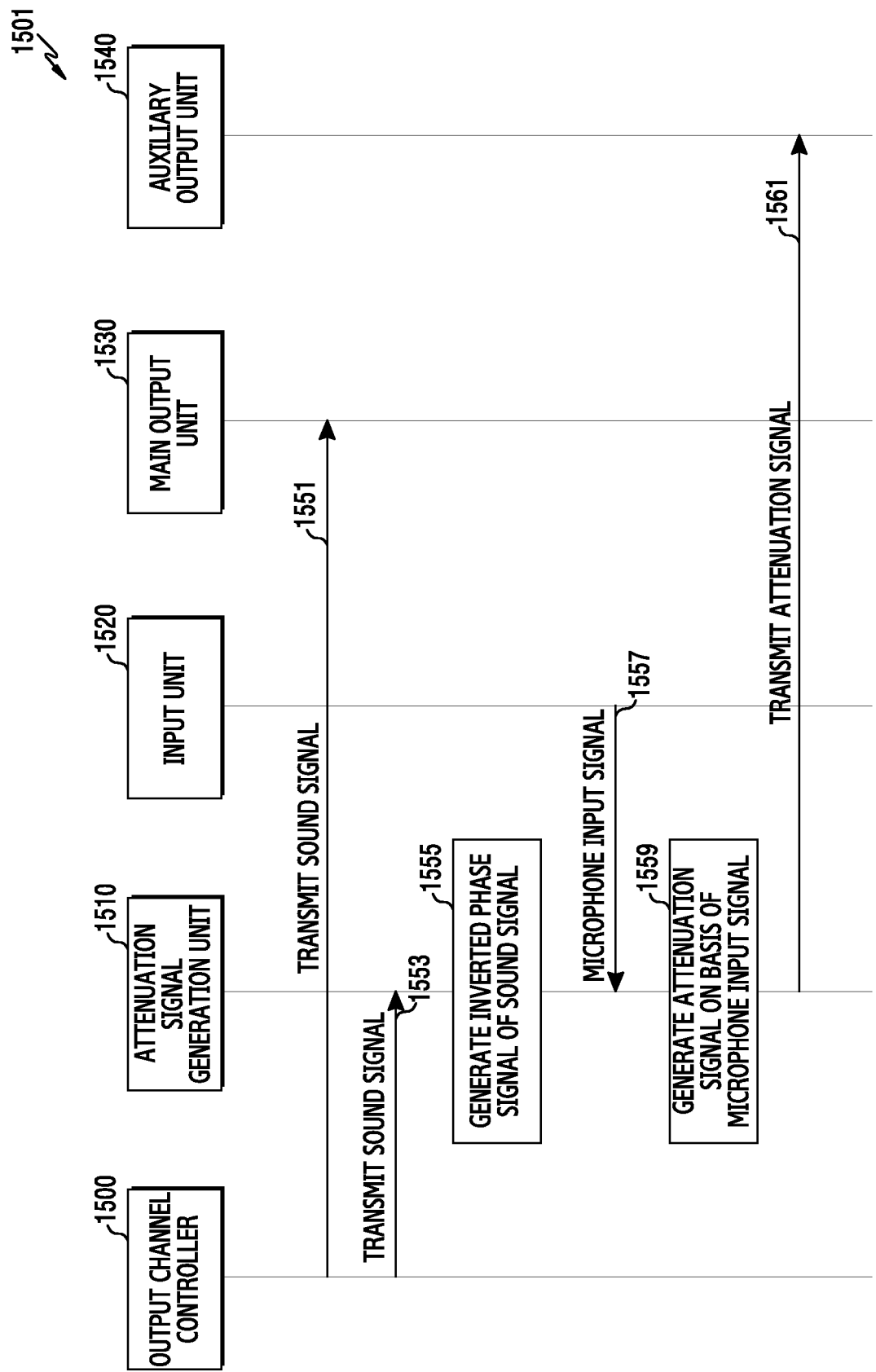
FIG. 15 is a signal flow diagram illustrating a process of generating an attenuation signal corresponding to an external environment parameter by an electronic device, according to an embodiment of the present disclosure.

FIG. 15 is a signal flow diagram illustrating a process of generating an attenuation signal corresponding to an external environment parameter by an electronic device, according to an embodiment of the present disclosure. Hereinafter, an operation for outputting the attenuation signal, which is generated in operations of FIG. 13 or 14, by the electronic device 700 or 900 as shown in FIGS. 7 and 9, respectively, will be described.

Referring to FIG. 15, an electronic device 1501 includes an output channel controller 1500, an attenuation signal generation unit 1510, an input unit 1520, a main output unit 1530, and an auxiliary output unit 1540.

The output channel controller 1500 transmits, at operation 1551 and 1553, a sound signal to be output externally through the main output unit 1530 to the main output unit 1530 and the attenuation signal generation unit 1510, respectively. For example, the sound signal may include a voice signal received from the external electronic devices 202 or 204 or the server 206 or an audio signal stored in the memory 230.

The main output unit 1530 converts the sound signal provided from the output channel controller 1500 into an analog signal to output the analog signal outside.

The attenuation signal generation unit 1510 generates, at operation 1555, an inverted phase signal of the sound signal provided from the output channel controller 1500. For example, the attenuation signal generation unit 1510 generates the inverted phase signal of the sound signal provided from the output channel controller 1500 and then store the inverted phase signal in the buffering unit 801.

The input unit 1520 transmits, at operation 1557, a sound signal (e.g., a microphone input signal), collected externally, to the attenuation signal generation unit 1510. For example, the input controller 770, shown in FIG. 7, provides the sound signal collected through the input unit 1520 to the attenuation signal generation unit 1510.

The attenuation signal generation unit 1510 detects the external environment parameter in the sound signal provided from the input unit 1520. The attenuation signal generation unit 1510 generates, at operation 1559, the attenuation signal by filtering an inverted phase signal of the sound signal based on the external environment parameter. That is, the attenuation signal generation unit 1510 filters the inverted phase signal of the sound signal based on the external environment parameter and then generates an attenuation signal which is transformed to correspond to the external environment parameter.

The attenuation signal generation unit 1510 transmits, at operation 1561, the attenuation signal corresponding to the sound signal output through the main output unit 1530 to the auxiliary output unit 1540.

The auxiliary output unit 1540 converts the attenuation signal provided from the attenuation signal generation unit 1510 into an analog signal to output the analog signal outside.

Figure 16:
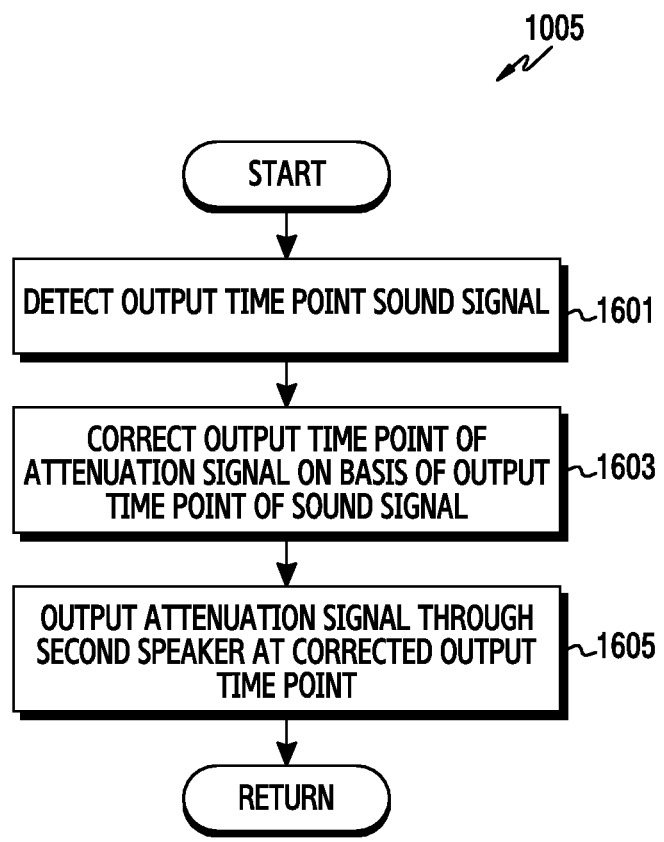
FIG. 16 is a flow chart illustrating a process of outputting an attenuation signal by an electronic device, according to an embodiment of the present disclosure.

FIG. 16 is a flow chart illustrating a process of outputting an attenuation signal by an electronic device according to an embodiment of the present disclosure. Hereinafter, as shown in operation 1005 of FIG. 10, an operation for outputting the attenuation signal by the electronic device (500, 700, or 900) as shown in FIG. 5, 7, or 9 will be described.

Referring to FIG. 16, in operation 1601, an electronic device detects an output time point of a sound signal to be output through the first speaker 282. For example, the synchronization controller 605, shown in FIG. 6, detects an output time point of the sound signal for the main output unit 550 (e.g., the first speaker 282).

In operation 1603, the electronic device corrects the output time point of the attenuation signal based on the output time point of the sound signal using the first speaker. For example, synchronization controller 605 selects an attenuation signal corresponding to the sound signal to be output through the main output unit 550.

In operation 1605, the electronic device outputs the attenuation signal corresponding to the corrected output time point externally through the second speaker 284. For example, the synchronization controller 605 outputs the attenuation signal corresponding to the sound signal to be output through the main output unit 550 selected in step 1603, externally through the auxiliary output unit 552 (e.g., the second speaker 284). The auxiliary output unit 552 outputs the attenuation signal with a small volume included in a pre-defined range not to affect the sound signal output through the main output unit 550.

Figure 17:
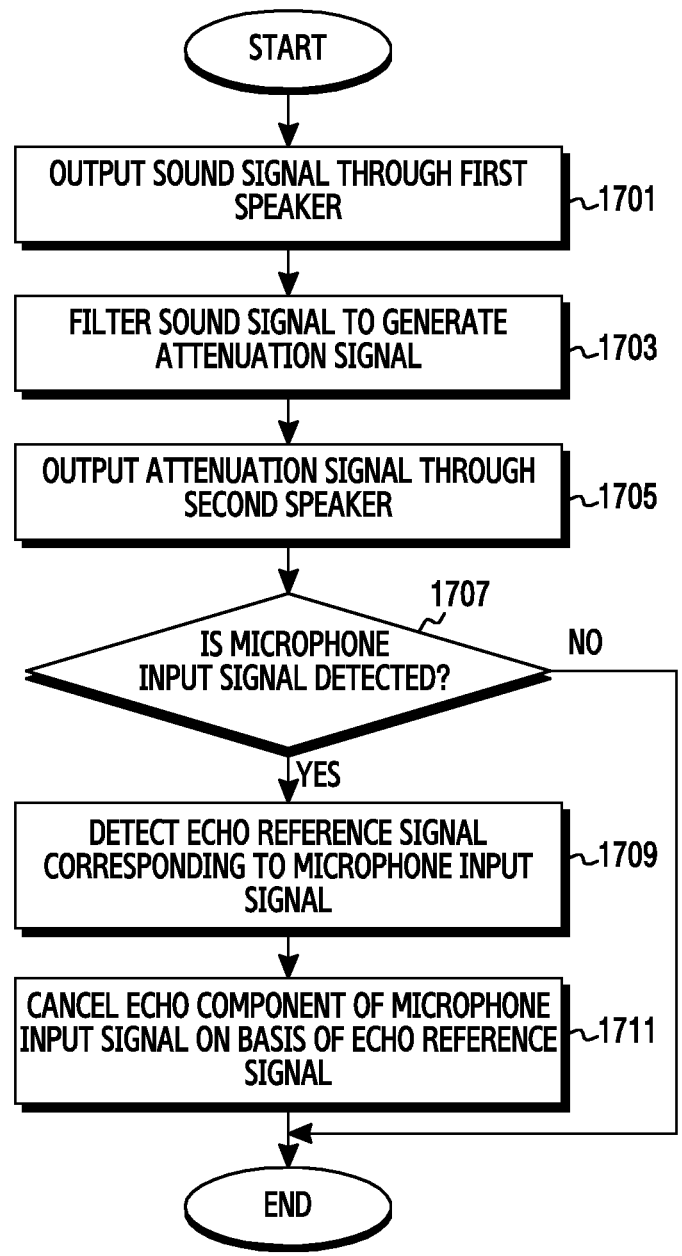
FIG. 17 is a flow chart illustrating a process of cancelling an echo component by an electronic device, according to an embodiment of the present disclosure.

FIG. 17 is a flow chart illustrating a process of cancelling an echo component by an electronic device, according to an embodiment of the present disclosure. Hereinafter, an operation for cancelling the echo component by the electronic device 900 shown in FIG. 9 will be described.

Referring to FIG. 17, in operation 1701, an electronic device outputs at least one sound signal through the first speaker 282. For example, the electronic device 900 converts a voice signal received from the external electronic devices 202 or 204 through the communication interface 270, or an audio signal stored in the memory 230 into an analog signal and then outputs the analog signal externally through the main output unit 950 (e.g., the first speaker 282).

In operation 1703, the electronic device filters a sound signal output outside through the first speaker and then generates an attenuation signal for cancelling at least a part of echo by the sound signal. For example, the attenuation signal generation unit 940, shown in FIG. 9, inverts a phase of a sound signal to be output through the main output unit 950 to generate the attenuation signal, as shown in FIG. 11. For example, the attenuation signal generation unit 940 filters the inverted phase signal of the sound signal provided from the output channel controller 930 based on the external environment element to generate the attenuation signal, as shown in FIG. 13 or 14.

In operation 1705, the electronic device outputs externally an attenuation signal for cancelling at least a part of the echo by the sound signal output externally through the first speaker, through the second speaker 284. For example, the attenuation signal generation unit 940, shown in FIG. 9, selects an attenuation signal corresponding to the sound signal to be output through the main output unit 950 and then outputs the attenuation signal externally through the auxiliary output unit 952 (e.g., the second speaker 284).

In operation 1707, the electronic device identifies whether a microphone input signal is detected. For example, the electronic device 900 identifies whether the microphone input signal is detected through the input unit 960.

In operation 1709, the electronic device detects echo reference data for cancelling an echo component from the microphone input signal when the microphone input signal has been detected. For example, the AEC 981 configures a sound signal corresponding to the microphone input signal provided from the output channel controller 930 as echo reference data.

In operation 1711, the electronic device cancels at least a part of an echo component included in the microphone input signal based on the echo reference data. For example, the AEC 981 detects a frequency characteristic for the microphone input signal collected through the input unit 960. The AEC 981 cancels at least a part of the echo component having a frequency characteristic similar to the echo reference data of the microphone input signal. Additionally, the AEC 981 cancels at least a part of the echo component included in the microphone input signal by updating the echo reference data to correspond to the external environment parameter.

Figure 18:
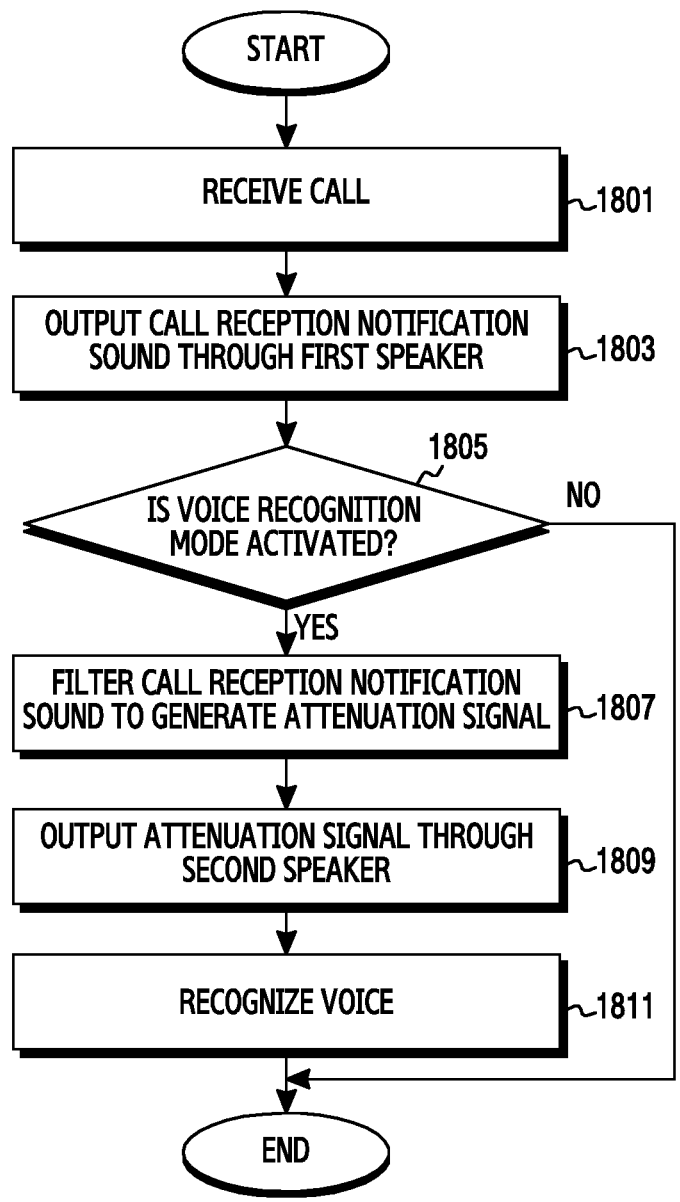
FIG. 18 is a flow chart illustrating a process of cancelling an echo component and then recognizing a voice by an electronic device, according to an embodiment of the present disclosure.

FIG. 18 is a flow chart illustrating a process of cancelling an echo component and then recognizing a voice by an electronic device, according to an embodiment of the present disclosure. Hereinafter, an operation for canceling an echo component by the electronic device 500, 700, or 900 as shown in FIGS. 5, 7, and 9, respectively, will be described.

Referring to FIG. 18, in operation 1801, an electronic device receives a call from an external device. For example, the processor 220 of the electronic device 500 receives a call from the external electronic devices 202 or 204 through the communication interface 270.

In operation 1803, the electronic device outputs a call reception notification sound in response to the call reception through the first speaker 282. For example, the processor 220 detects a call reception notification sound (ringtone) stored in a memory as a response for the call reception and then outputs the call reception notification sound outside through the main output unit 550 (e.g., the first speaker 282).

In operation 1805, the electronic device identifies whether the electronic device is operated in a voice recognition mode for recognizing a voice at a call reception time point. For example, the processor 220 identifies whether the electronic device has received a call while a voice recognition application is driven.

In operation 1807, the electronic device generates the attenuation signal by filtering the call reception notification sound when the electronic device is being operated in the voice recognition mode at the call reception time point. For example, the processor 220 inverts a phase of a sound signal to be output through the main output unit 550 to generate the attenuation signal as shown in FIG. 11. For example, the processor 220 filters an inverted phase signal of the sound signal to be output through the main output unit 550 based on the external environment element to generate the attenuation signal, as shown in FIG. 13 or 14.

In operation 1809, the electronic device outputs the attenuation signal for cancelling echo by the call reception notification sound externally through the second speaker 284. For example, the processor 220 outputs an attenuation signal with a small volume through the auxiliary output unit 552 (e.g., the second speaker 284) adjacent to the input unit 560. Herein, the small volume includes a volume included in a predetermined reference volume range not to affect the sound signal output through the main output unit 550.

In operation 1811, the electronic device recognizes a voice using a microphone input signal. For example, when the processor 220 outputs the attenuation signal through the auxiliary output unit 552, the echo component of the sound signal output through the main output unit 550 is cancelled by the attenuation signal. Therefore, the processor 220 performs voice recognition based on the sound signal collected through the input unit 560.

Figure 19:
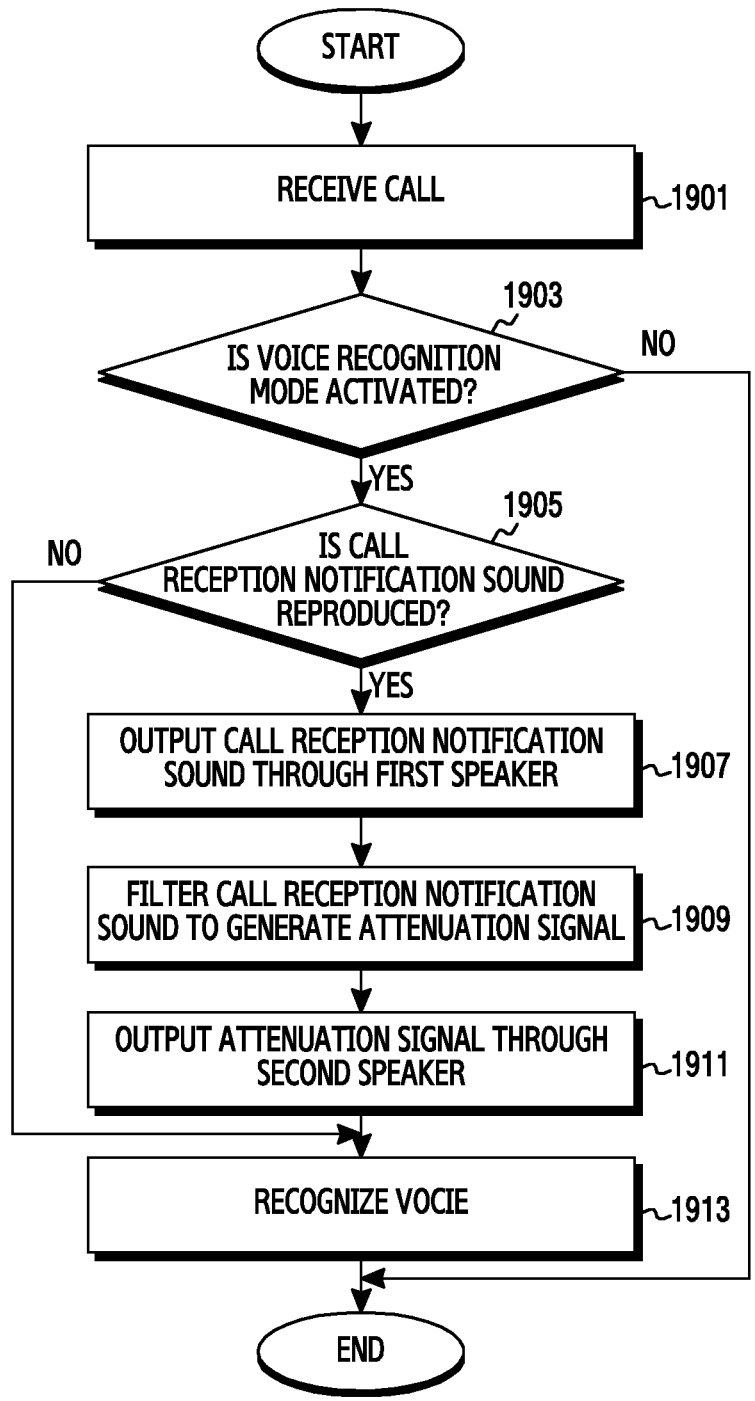
FIG. 19 is a flow chart illustrating a process of cancelling an echo component and then recognizing a voice by an electronic device, according to an embodiment of the present disclosure.

FIG. 19 is a flow chart illustrating a process of cancelling an echo component and then recognizing a voice by an electronic device, according to an embodiment of the present disclosure. Hereinafter, an operation for cancelling an echo component by the electronic device 500, 700, or 900 as shown in FIGS. 5, 7, and 9, respectively, will be described.

Referring to FIG. 19, in operation 1901, an electronic device receives a call from an external device. For example, the processor 220 of the electronic device 500 receives a call from the external electronic devices 202 or 204.

In operation 1903, the electronic device identifies whether the electronic device has received a call while a voice recognition application is driven.

In operation 1905, the electronic device determines whether the call reception notification sound is reproduced when the call has been received while the voice recognition application is driven. For example, the processor 220 determines whether the call reception notification sound is reproduced based on identification information of the call. The electronic device 500 determines whether the call reception notification sound is reproduced based on importance of a call identifier. The processor 220 identifies whether a reception notification sound reproduction menu is activated in the voice recognition mode.

In operation 1913, the electronic device recognizes a voice using the microphone input signal when it is determined that the call reception notification sound is not reproduced.

In operation 1907, the electronic device outputs the call reception notification sound through the first speaker 282 when it is determined that the call reception notification sound is reproduced. For example, the processor 220 detects a call reception notification sound (e.g., a ringtone) stored in the memory and then outputs the call reception notification sound externally through the main output unit 550 (e.g., the first speaker 282).

In operation 1909, the electronic device filters the call reception notification sound output through the first speaker to generate the attenuation signal. For example, the processor 220 inverts a phase of the call reception notification sound to be output through the main output unit 550 to generate the attenuation signal as shown in FIG. 11. The processor 220 filters an inverted phase signal of the call reception notification sound to be output through the main output unit 550 based on an external environment element to generate the attenuation signal as shown in FIG. 13 or 14.

In operation 1911, the electronic device outputs the attenuation signal for cancelling an echo by the call reception notification sound externally through the second speaker 284. For example, the processor 220 converts the attenuation signal into an analog signal through the auxiliary output unit 552 (e.g., the first speaker 282) to output the analog signal externally.

In operation 1913, the electronic device recognizes a voice using a microphone input signal. For example, the processor 220 cancels an echo component of the sound signal output through the main output unit 550 due to the attenuation signal output through the auxiliary output unit 552. Therefore, the processor 220 performs voice recognition based on the sound signal collected through the input unit 560.

Figure 20:
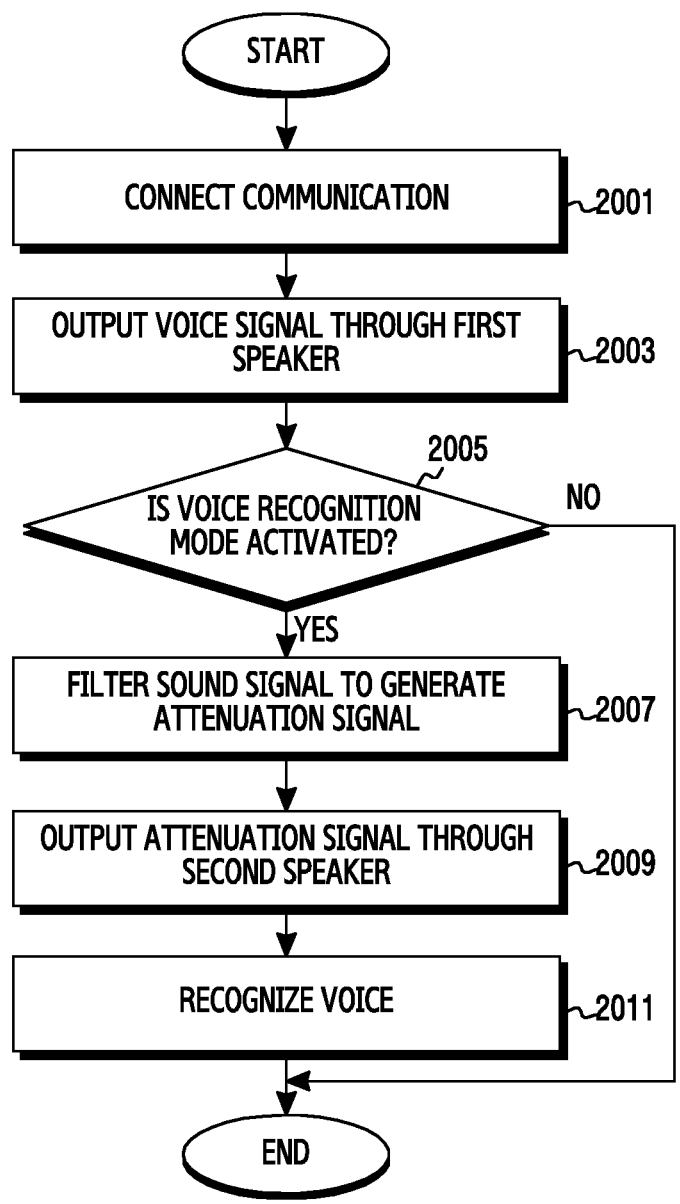
FIG. 20 is a flow chart illustrating a process of cancelling an echo component according to a communication service and then recognizing a voice by an electronic device, according to an embodiment of the present disclosure.

FIG. 20 is a flow chart illustrating a process of cancelling an echo component according to a communication service and then recognizing a voice by an electronic device, according to an embodiment of the present disclosure. Hereinafter, an operation for cancelling an echo component by the electronic device 500, 700, or 900 as shown in FIGS. 5, 7, and 9, respectively, will be described.

Referring to FIG. 20, in operation 2001, an electronic device communicates with an external device. For example, the electronic device 201 of FIG. 2 provides a voice communication service or an image communication service with the external electronic devices 202 or 204 through the communication interface 270.

In operation 2003, the electronic device outputs, through the first speaker 282, the voice signal received from the external device through a communication connection. For example, the electronic device 500 outputs a voice signal of a counterpart, which has been received from the external device, externally through the main output unit 550.

In operation 2005, the electronic device identifies whether a voice recognition mode is activated while the communication service is provided. For example, the electronic device 500 identifies whether the voice recognition application is executed based on input information while the communication service is provided.

The electronic device maintains the communication service with the external device when the voice recognition mode is not activated while the communication service is provided.

In operation 2007, when the voice recognition mode is activated while the communication service is provided, the electronic device filters the voice signal received from the external device to generate the attenuation signal. For example, the electronic device 500 generates the attenuation signal by inverting a phase of the sound signal, which is to be output through the main output unit 550, of a communication counterpart (in FIG. 11). The processor 220 of the electronic device 500 converts (e.g., filters) an inverted phase signal of the voice signal to be output through the main output unit 550 based on the external environment element to generate the attenuation signal (as shown in FIG. 13 or 14).

In operation 2009, the electronic device outputs an attenuation signal for cancelling an echo by the voice signal of the communication counterpart output through the first speaker, through the second speaker 284, externally. For example, the electronic device 500 outputs the attenuation signal through the auxiliary output unit 552 with a small volume. Herein, the small volume is a volume within a predetermined reference volume range which does not affect the sound signal output through the main output unit 550.

In operation 2011, the electronic device recognizes a voice using a microphone input signal. For example, an echo component of the voice signal, which is output through the main output unit 550, of the communication counterpart is cancelled by the attenuation signal output through the auxiliary output unit 552. Therefore, the electronic device 500 performs voice recognition based on the sound signal collected through the input unit 560 while the communication service is provided.

According to various embodiments of the present disclosure, an operation method of an electronic device includes converting a first digital signal related to a sound into a first analog signal; outputting the first analog signal as a first sound using at least a part of the plurality of speakers; filtering at least one of at least a part of the first analog signal and at least a part the output sound to generate a second analog signal; and outputting the second analog signal as a second sound using at least another part of the plurality of speakers.

According to various embodiments, the operation method may further include filtering at least a part of the first digital signal to generate a second digital signal; obtaining at least a part of the output first sound using at least one microphone and then converting the obtained at least a part of the output first sound into a third analog signal; converting at least a first part of the third analog signal into a third digital signal; and cancelling the at least a first part of the third digital signal using the second digital signal.

According to various embodiments, the at least the first part of the third analog signal may include an echo component by the output first sound.

According to various embodiments, an operation of generating the second analog signal includes obtaining at least a part of the output first sound using the at least one microphone; converting the obtained at least a part of the output first sound into the third analog signal; and filtering at least one of the at least a part of the first analog signal and the at least a part of the output first sound based on at least a second part of the third analog signal and then generating the second analog signal.

According to various embodiments, the at least the second part of the third analog signal may include at least one of a noise component and a delay distortion signal which flows in to the at least one microphone.

According to various embodiments, the at least the other part of the plurality of speakers may be arranged adjacent to the at least one microphone.

According to various embodiments, an operation of generating the second analog signal includes inverting a phase of at least a part of the converted first analog signal and/or at least a part of the output first sound and then generating the second analog signal.

According to various embodiments, the operation method may further include obtaining the at least a part of the output first sound using the at least one microphone and then convert the obtained at least a part of the first output sound into the third analog signal; determining whether at least a part of the third analog signal can be cancelled based on the second analog signal; and filtering the second analog signal based on at least another part of the third analog signal when it is determined that the at least a part of the third analog signal cannot be cancelled based on the second analog signal.

According to various embodiments, the operation method may further include obtaining an external sound using the at least one microphone; and recognizing a voice based on the external sound.

The term "module" as used herein may refer to a unit including one of hardware, software, and firmware or a combination of two or more of them. The "module" may be interchangeably used with the term "unit", "logic", "logical block", "component", or "circuit". The "module" may be a minimum unit of an integrated component element or a part thereof. The "module" may be a minimum unit for performing one or more functions or a part thereof. The "module" may be mechanically or electronically implemented. For example, the "module" according to the present disclosure may include at least one of an Application-Specific Integrated Circuit (ASIC) chip, a Field-Programmable Gate Arrays (FPGA), and a programmable-logic device for performing operations which has been known or are to be developed hereinafter.

According to various embodiments, at least some of the devices or modules or functions thereof, or the method (i.e., operations) according to the present disclosure may be implemented by a command stored in a computer-readable storage medium in a programming module form. When an instruction is implemented by one or more processors (for example, the processor 220), one or more processors may execute a function corresponding to the instruction. The computer-readable storage medium may be the memory 230.

The computer readable recoding medium may include a hard disk, a floppy disk, magnetic media (for example, a magnetic tape), optical media (for example, a compact disc read only memory (CD-ROM) and a DVD), magneto-optical media (for example, a floptical disk), a hardware device (for example, a read only memory (ROM), a random access memory (RAM), a flash memory), and the like. In addition, the program instructions may include high level language codes, which can be executed in a computer by using an interpreter, as well as machine codes made by a compiler. Any of the hardware devices as described above may be configured to work as one or more software modules in order to perform the operations according to various embodiments of the present disclosure, and vice versa.

Any of the modules or programming modules according to various embodiments of the present disclosure may include at least one of the above described elements, exclude some of the elements, or further include other additional elements. The operations performed by the modules, programming module, or other elements may be executed in a sequential, parallel, repetitive, or heuristic manner. Further, some operations may be executed according to another order or may be omitted, or other operations may be added.

The embodiments disclosed herein are proposed to help with description and comprehension of disclosed technical contents, and do not limit the scope of various embodiments of the present disclosure. Therefore, the scope of the various embodiments of the present disclosure should be construed as including all modifications or various other embodiments based on the spirit and scope of the various embodiments of the present disclosure. The scope of the present disclosure is not defined by the detailed description and embodiments, but by the following claims and their equivalents, and all differences within the scope will be construed as being included in the present disclosure.

What is claimed is:

1. An electronic device comprising:
    a housing;
    at least one microphone;
    a plurality of speakers; and
    a circuit included in the housing and electrically connected to the at least one microphone and the plurality of speakers,
    wherein the circuit is configured to:
    convert a first digital signal related to a sound into a first analog signal,
    output the first analog signal as a first sound using at least a part of the plurality of speakers,
    invert a phase of at least a part of the first analog signal,
    identify an external noise signal included in a signal received via the at least one microphone, wherein the signal includes the first analog signal and the external noise signal,
    filter the inverted at least a part of the first analog signal based on the external noise signal, to generate a second analog signal, and
    output the second analog signal as a second sound using at least another part of the plurality of speakers, and
    wherein the at least another part of the plurality of speakers is arranged adjacent to the at least one microphone, and is configured to output the second analog signal at a volume smaller than a reference volume so that the second sound does not affect the first sound.

2. The electronic device of claim 1, further comprising:
a processor in the housing; and
a memory electrically connected to the processor,
wherein the memory stores instructions which, when executed, direct the processor to:
obtain an external sound using the at least one microphone, and
perform voice recognition based on the external sound.

3. The electronic device of claim 2, wherein the instructions comprise instructions directing the processor to determine whether a voice recognition mode is activated while a communication service is provided, and control the circuit to output the second analog signal in response to activation of the voice recognition mode.

4. A method of operating an electronic device, the method comprising:
converting a first digital signal related to a sound into a first analog signal;
outputting the first analog signal as a first sound using at least a part of the plurality of speakers;
inverting a phase of at least a part of the first analog signal;
identifying an external noise signal included in a signal received via the at least one microphone, wherein the signal includes the first analog signal and the external noise signal;
filtering the inverted at least a part of the first analog signal based on the external noise signal, to generate a second analog signal; and
outputting the second analog signal as a second sound using at least another part of the plurality of speakers, and
wherein the at least another part of the plurality of speakers is arranged adjacent to the at least one microphone, and is configured to output the second analog signal at a volume smaller than a reference volume so that the second sound does not affect the first sound.

5. The method of claim 4, further comprising:
filtering at least a part of the first digital signal to generate a second digital signal;
obtaining at least a part of the output first sound using at least one microphone;
converting the obtained at least a part of the output first sound into a third analog signal;
converting at least a first part of the third analog signal into a third digital signal; and
cancelling the at least the first part of the third digital signal using the second digital signal.

6. The method of claim 5, wherein the at least the first part of the third analog signal comprises an echo component by the output first sound.

7. The method of claim 4, further comprising:
obtaining an external sound using the at least one microphone; and
recognizing a voice based on the external sound.

8. The method of claim 4, wherein outputting the second analog signal comprises:
determining whether a voice recognition mode is activated while a communication service is provided; and
outputting the second analog signal in response to activation of the voice recognition mode.

* * * * *